US012598985B2

(12) United States Patent
Kao et al.

(10) Patent No.: US 12,598,985 B2
(45) Date of Patent: Apr. 7, 2026

(54) SEMICONDUCTOR STRUCTURE AND FORMING METHOD THEREOF

(71) Applicant: TAIWAN SEMICONDUCTOR MANUFACTURING COMPANY LTD., Hsinchu (TW)

(72) Inventors: Min-Feng Kao, Chiayi City (TW); Dun-Nian Yaung, Taipei City (TW); Hsing-Chih Lin, Tainan City (TW); Jen-Cheng Liu, Hsin-Chu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 587 days.

(21) Appl. No.: 18/150,192

(22) Filed: Jan. 4, 2023

(65) Prior Publication Data

US 2024/0222262 A1    Jul. 4, 2024

(51) Int. Cl.
H01L 23/522 (2006.01)
H01L 23/00 (2006.01)
H10F 39/00 (2025.01)

(52) U.S. Cl.
CPC .......... H01L 23/5223 (2013.01); H01L 24/08 (2013.01); H01L 24/80 (2013.01); H10F 39/018 (2025.01); H10F 39/809 (2025.01); H10F 39/811 (2025.01); H01L 2224/08145 (2013.01); H01L 2224/80895 (2013.01); H01L 2224/80896 (2013.01); H01L 2924/19041 (2013.01); H01L 2924/19104 (2013.01)

(58) Field of Classification Search
CPC ..... H01L 23/5223; H01L 24/08; H01L 24/80; H10F 39/018; H10F 39/811
See application file for complete search history.

(56) References Cited

U.S. PATENT DOCUMENTS

| | | | | |
|---|---|---|---|---|
| 10,651,157 | B1 * | 5/2020 | Su | H01L 25/0657 |
| 11,158,622 | B1 * | 10/2021 | Zhang | H01L 25/50 |
| 2010/0193964 | A1 * | 8/2010 | Farooq | H01L 25/0657 |
| | | | | 257/E21.585 |
| 2010/0225002 | A1 * | 9/2010 | Law | H01L 23/481 |
| | | | | 257/E21.597 |
| 2011/0241167 | A1 * | 10/2011 | Feustel | H01L 23/5223 |
| | | | | 257/532 |
| 2016/0049384 | A1 * | 2/2016 | Lu | H10D 88/00 |
| | | | | 257/737 |
| 2019/0165027 | A1 * | 5/2019 | Ishino | H10F 39/809 |
| 2020/0119134 | A1 * | 4/2020 | Leobandung | H01L 23/5223 |
| 2020/0127032 | A1 * | 4/2020 | Ogino | H01L 24/80 |
| 2020/0135844 | A1 * | 4/2020 | Takahashi | H01L 21/76849 |
| 2020/0328188 | A1 * | 10/2020 | Liu | H01L 25/0652 |

(Continued)

*Primary Examiner* — Nathan W Ha

(74) *Attorney, Agent, or Firm* — WPAT LAW; Anthony King

(57) ABSTRACT

A semiconductor structure is provided. The semiconductor structure includes a first die and a second die. The first die includes a substrate, an interconnection structure and a capacitor structure. The substrate has a front-side surface and a back-side surface. The interconnection structure is disposed over the front-side surface. The capacitor structure extends from the back-side surface to the front-side surface and into the interconnection structure. The second die is disposed over the back-side surface and is bonded to the first die. A method for forming a semiconductor structure is also provided.

20 Claims, 20 Drawing Sheets

(56) References Cited

U.S. PATENT DOCUMENTS

| | | | |
|---|---|---|---|
| 2020/0402903 A1* | 12/2020 | Chen | H01L 23/481 |
| 2021/0159224 A1* | 5/2021 | Shen | H10D 1/696 |
| 2021/0265295 A1* | 8/2021 | Liu | H10B 12/03 |
| 2021/0265313 A1* | 8/2021 | Chen | H01L 23/5223 |
| 2021/0296283 A1* | 9/2021 | Huang | H01L 25/0657 |
| 2021/0375914 A1* | 12/2021 | Zhang | H10B 41/27 |
| 2021/0384093 A1* | 12/2021 | Verma | H01L 23/564 |
| 2021/0391315 A1* | 12/2021 | Zhang | H01L 25/18 |
| 2022/0028829 A1* | 1/2022 | Cheng | H01L 21/78 |
| 2022/0037267 A1* | 2/2022 | Zhang | H01L 24/08 |
| 2022/0037388 A1* | 2/2022 | Takizawa | H01L 24/80 |
| 2022/0084969 A1* | 3/2022 | Colgan | H01L 23/544 |
| 2022/0157847 A1* | 5/2022 | Zhang | H01L 21/3115 |
| 2022/0278095 A1* | 9/2022 | Kao | H10D 8/411 |
| 2022/0367394 A1* | 11/2022 | Sun | H01L 25/50 |
| 2023/0066372 A1* | 3/2023 | Chang | H01L 23/5223 |
| 2023/0069315 A1* | 3/2023 | Chang | H01L 24/33 |
| 2023/0075180 A1* | 3/2023 | Inoue | H10D 30/67 |
| 2023/0260977 A1* | 8/2023 | Chen | H01L 24/16 |
| | | | 257/690 |
| 2024/0021488 A1* | 1/2024 | Sun | H01L 25/0657 |
| 2024/0030117 A1* | 1/2024 | Costa | H01L 24/73 |
| 2024/0105545 A1* | 3/2024 | Lu | H01L 25/0652 |
| 2024/0105699 A1* | 3/2024 | Dabral | H01L 23/49816 |
| 2024/0222261 A1* | 7/2024 | Kao | H01L 24/80 |

* cited by examiner

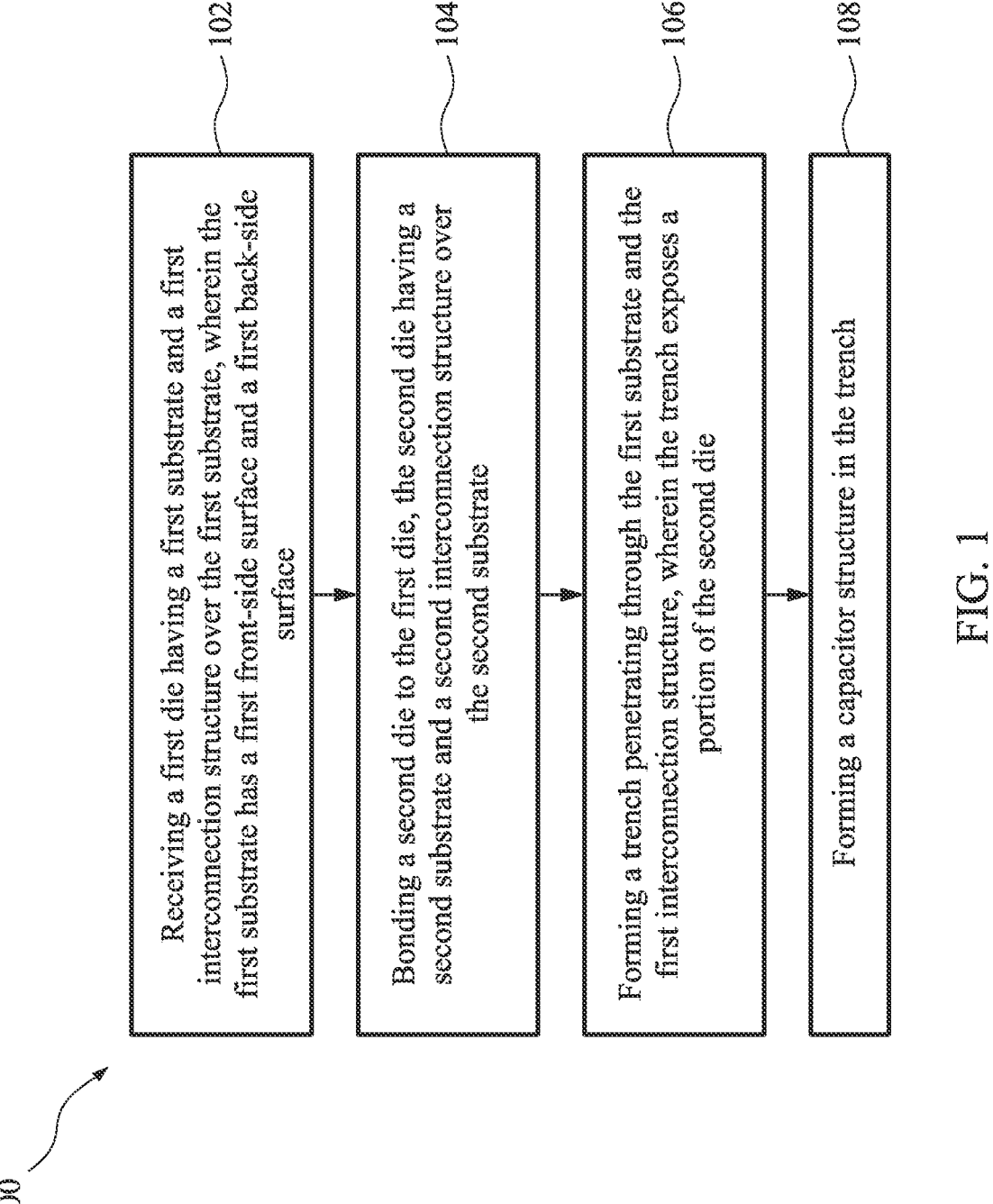

Receiving a first die having a first substrate and a first interconnection structure over the first substrate, wherein the first substrate has a first front-side surface and a first back-side surface ⟿ 102

Bonding a second die to the first die, the second die having a second substrate and a second interconnection structure over the second substrate ⟿ 104

Forming a trench penetrating through the first substrate and the first interconnection structure, wherein the trench exposes a portion of the second die ⟿ 106

Forming a capacitor structure in the trench ⟿ 108

SEMICONDUCTOR STRUCTURE AND FORMING METHOD THEREOF

BACKGROUND

The semiconductor integrated circuit (IC) industry has experienced rapid growth. In the course of IC evolution, functional density (i.e., the number of interconnected devices per chip area) has generally increased while geometry size (i.e., size of the smallest component (or line) that can be created using a fabrication process) has decreased. This scaling down process generally provides benefits by increasing production efficiency and lowering associated costs. Such scaling down has also increased the complexity of processing and manufacturing ICs, and, for these advances to be realized, similar developments in IC manufacturing are needed.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

FIG. 1 is a flowchart representing a method for forming a semiconductor structure according to aspects of one or more embodiments of the present disclosure.

DETAILED DESCRIPTION

Figure 2:
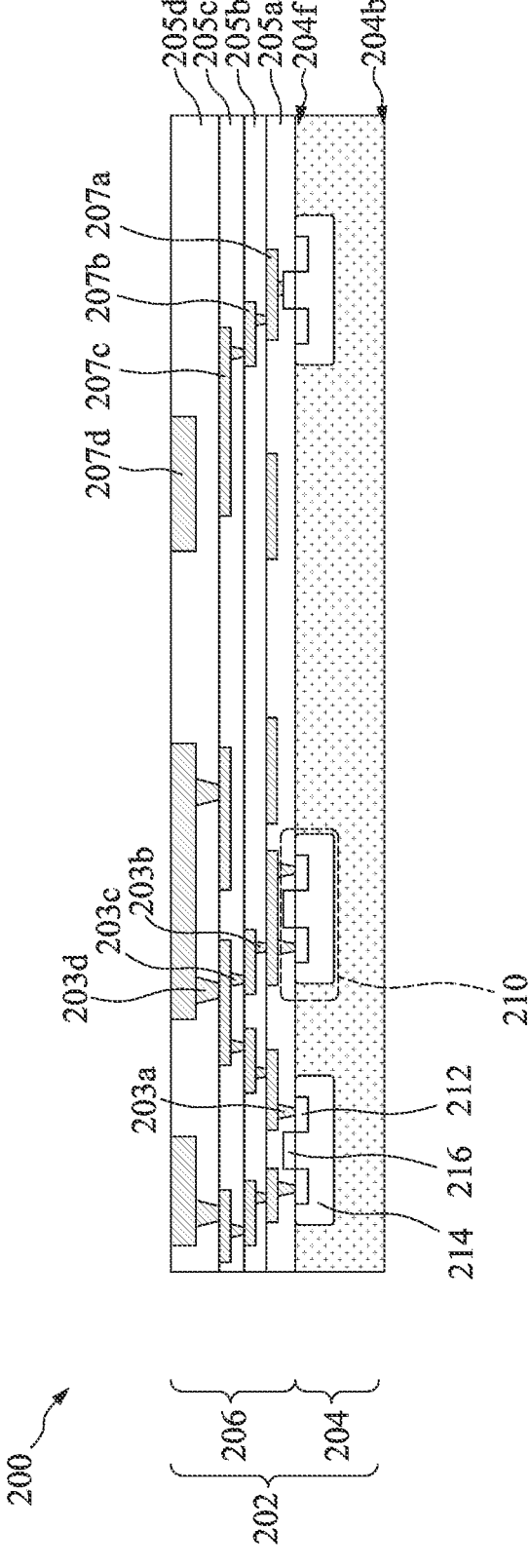
FIGS. 2 to 16 are schematic drawings illustrating a semiconductor structure at various fabrication stages constructed according to aspects of the present disclosure in one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. The specific embodiments discussed are merely illustrative of specific ways to make and use the embodiments, and do not limit the scope of the disclosure. Throughout the various views and illustrative embodiments, like reference numerals are used to designate like elements. Reference will now be made in detail to exemplary embodiments illustrated in the accompanying drawings. Wherever possible, same reference numbers are used in the drawings and the description to refer to same or similar parts. In the drawings, shape and thickness may be exaggerated for clarity and convenience. It should be appreciated that the following figures are not drawn to scale; rather, these figures are merely intended for illustration.

Further, spatially relative terms, such as "beneath," "below," "lower," "above," "over," "upper,". "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

Passive devices, such as metal-insulator-metal (MIM) or metal-oxide-metal (MOM) capacitors, are commonly embedded in integrated circuits (ICs) and are used to reduce sizes of ICs, reduce costs of ICs, increase functionality of ICs, or any combination of the foregoing. In some instances, the MIM or MOM capacitor is arranged in an interconnection structure overlying a front side of a semiconductor substrate. For example, the interconnection structure can be comprised of a number of horizontal metal lines (e.g., wires) stacked over one another and interconnected by vertical vias, wherein the interconnection structure operably connects semiconductor devices (e.g., transistors) on the front side of the semiconductor substrate to one another to implement a predefined circuit configuration. The MIM/MOM capacitor may have its electrodes formed in the interconnection structure over the front side of the substrate, such that the MIM/MOM capacitor is easily integrated with the rest of the IC. However, when large capacitance values are required, a large area on the IC is generally needed for such MIM/MOM capacitors. In many instances, such increase in area adds cost to the IC, and is thus in some regards a less-than-optimal solution. Accordingly, an alternative approach to forming a capacitor with greater capacitance is therefore of primary importance.

Some embodiments of the present disclosure provide a semiconductor structure and methods for manufacturing a semiconductor structure that provide one or more improvements over existing approaches. The present disclosure is directed toward a semiconductor structure in which passive devices are arranged through neighboring interconnection structures of different dies. In some embodiments, a capacitor structure extends from a first interconnection structure to a second interconnection structure. Advantageously, due to arrangement of passive devices through different dies, the capacitor structure may provide a relatively high capacitance value while occupying a relatively small footprint. Further, design freedom and flexibility may be increased since passive devices may be distributed through neighboring interconnection structures of different dies.

FIG. 1 is a flowchart representing a method 100 for forming a semiconductor structure according to aspects of one or more embodiments of the present disclosure. The method 100 includes an operation 102, in which a first die is received. In some embodiments, the first die has a first substrate and a first interconnection structure over the first substrate, and the first substrate has a first front-side surface and a first back-side surface. The method 100 includes an operation 104, in which a second die is bonded to the first die. In some embodiments, the second die has a second substrate and a second interconnection structure over the second substrate. The method 100 includes an operation 106, in which a trench penetrating through the first substrate and the first interconnection structure is formed. In some embodiments, the trench exposes a portion of the second die. The method 100 includes an operation 108, in which a capacitor structure is formed in the trench. The method 100 for forming the semiconductor structure will be further described according to one or more embodiments. It should be noted that the operations of the method 100 may be rearranged or otherwise modified within the scope of the various aspects. It should be further noted that additional operations may be provided before, during, and after the method 100, and that some other operations may only be briefly described herein. Thus, other implementations are possible within the scope of the various aspects described herein.

FIGS. 2 to 16 are schematic drawings illustrating a semiconductor structure 200 at various fabrication stages constructed according to aspects of the present disclosure in one or more embodiments.

Referring to FIG. 2, a first die 202 is provided or received. The respective step is shown as the operation 102 of the method 100 in FIG. 1. The first die 202 may include a substrate 204. The substrate 204 may comprise, for example, a bulk semiconductor substrate, a SOI substrate, or some other semiconductor substrate. Further, the semiconductor substrate(s) may be or comprise, for example, monocrystalline silicon, some other silicon, or some other semiconductor material. The substrate 204 has a front-side surface 204f and a back-side surface 204b. One or more semiconductor devices 210, such as transistors, are disposed on the front-side surface 204f. The illustrated semiconductor device 210 manifests as a transistor that includes source/drain regions 212 that are doped with a first doping conductivity (e.g., n-type). As used herein, the term "source/drain region(s)" may refer to a source or a drain, individually or collectively, depending upon the context. A body region, which is illustrated as corresponding to a well region 214 in FIG. 2, is doped with a second doping conductivity (e.g., p-type), and separates the source/drain regions 212 from one another. The second doping type is opposite to the first doping type. A gate structure 216 is disposed over the body region. The gate structure 216 may include a gate electrode (not shown) and a gate dielectric (not shown), and the gate electrode is separated from the body region by the gate dielectric. Other semiconductor devices, including active devices such as bipolar junction transistors (BJTs) or finFETs for example and/or passive devices such as resistors or diodes for example, may be present on the front-side surface 204f.

The first die 202 may include an interconnection structure 206 over the substrate 204. The interconnection structure 206 is disposed over the front-side surface 204f. The interconnection structure 206 includes a plurality of metal lines and metal vias that operably couple the semiconductor devices 210 to one another. The interconnection structure 206 includes a plurality of conductive layers embedded in dielectric material layers. The dielectric material layers include a plurality of interlayer dielectric (ILD) layers or inter-metal dielectric (IMD) layers 205a, 205b, 205c and 205d, wherein each ILD layer may comprise a suitable dielectric material. For example, in the present embodiments, the ILD layers 205a, 205b, 205c and 205d may comprise a low dielectric constant (low-k) material, the material having a dielectric constant lower than that of thermal silicon oxide. In other embodiments, the ILD layers 205a, 205b, 205c and 205d comprise silicon dioxide or another dielectric material. In some embodiments, an etch stop layer (not shown) is formed between adjacent ILD layers (e.g., 205a and 205b), and separates the adjacent ILD layers from one another. The dielectric material layer may be formed by CVD, HDPCVD, PECVD, combinations thereof, or other suitable processes. For purposes of illustration, only four ILD layers are shown in FIG. 2, but it should be understood that any number of ILD layers may be implemented and that the ILD layers as illustrated are merely exemplary.

The conductive layers in the interconnection structure 206 provide interconnections between the various semiconductor devices 210. The conductive layers comprise metal lines including first metal lines 207a, second metal lines 207b, third metal lines 207c and so on to the topmost metal line 207d. The conductive layers further comprise contacts 203a to couple the first metal lines 207a to the semiconductor devices 210, and vias 203b, 203c and 203d to couple adjacent metal lines (e.g., 207b and 207c). The conductive layers of the interconnection structure 206 may comprise conductive materials such as aluminum, aluminum/silicon/copper alloy, titanium, titanium nitride, tungsten, polysilicon, metal silicide, or combinations thereof, formed by a process including physical vapor deposition (PVD), chemical vapor deposition (CVD), combinations thereof, or other suitable processes. Other manufacturing techniques used to form the interconnection structure 206 may include photolithography processing and etching to pattern the conductive materials for vertical connection (for example, vias/contacts) and horizontal connection (for example, metal lines). Alternatively, a multilayer copper interconnection structure may be used to form the metal patterns. The copper interconnection structure may comprise copper, copper alloy, titanium, titanium nitride, tantalum, tantalum nitride, tungsten, polysilicon, metal silicide, or combinations thereof. The copper interconnection structure may be formed by damascene technique including dielectric deposition, etching, deposition and planarization. The deposition may comprise sputtering, electroplating, CVD or other suitable processes.

Figure 3:
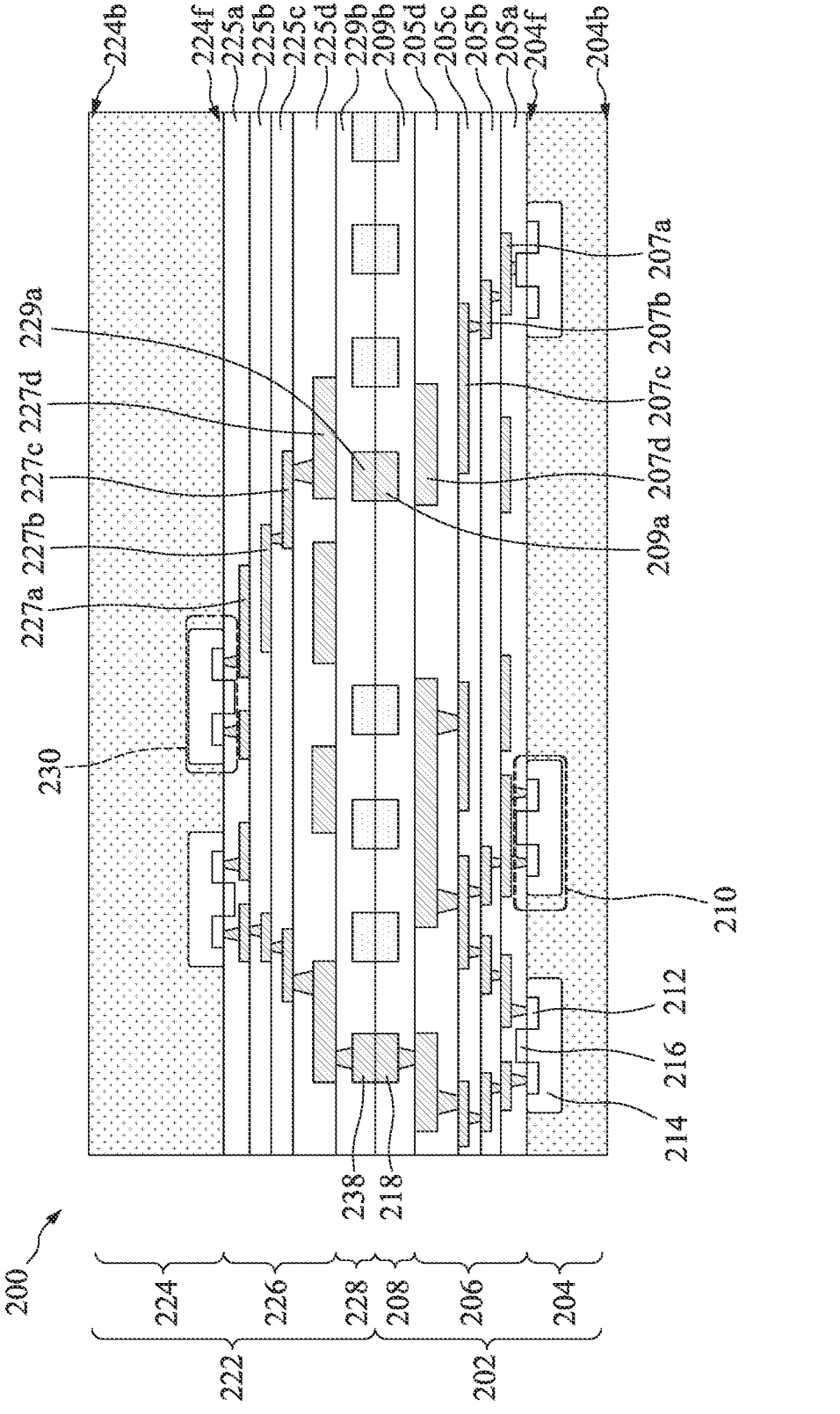

Referring to FIG. 3, in some embodiments, a second die 222 is bonded to the first die 202. The respective step is shown as the operation 104 of the method 100 in FIG. 1. The second die 222 may include a substrate 224 having a front-side surface 224f and a back-side surface 224b. The substrate 224 is disposed over the substrate 204. The front-side surface 224f faces the front-side surface 204f. The interconnection structure 206 is disposed between the front-side surface 204f of the substrate 204 and the front-side surface 224f of the substrate 224. The second die 222 may include an interconnection structure 226 disposed over the front-side surface 224f. The interconnection structure 226 is disposed between the interconnection structure 206 and the front-side surface 224f of the substrate 224. The interconnection structure 226 includes a plurality of metal lines 227a, 227b, 227c and 227d and metal vias that operably couple semiconductor devices 230 disposed in or on the front-side surface 224f of the substrate 224 to one another. The metal lines 227a, 227b, 227c, 227d and metal vias are respectively embedded in ILD layers 225a, 225b, 225c and 225d. Many aspects of the substrate 224 and the interconnection structure 226 are similar to those of the substrate 204 and the interconnection structure 206, and repeated descriptions thereof are omitted for brevity.

Various bonding structures are formed to bond the various substrates and interconnection structures to one another. For example, a bonding structure 208 disposed on the interconnection structure 206 is bonded to a bonding structure 228 disposed on the interconnection structure 226. The bonding structure 208 corresponds to the bonding structure 228 and is bonded to the bonding structure 228. In some embodiments, the bonding structure 208 includes conductive features (e.g., metal features 209a) disposed in a dielectric layer 209b, and the bonding structure 228 includes conductive features (e.g., metal features 229a) disposed in a dielectric layer 229b. The dielectric layer 229b may be a multi-layered structure including one or more dielectric material layers and one or more etch stop layers between the dielectric material layers. Further, some metal features (e.g., a metal feature 218) of the bonding structure 208 may be electrically coupled to the semiconductor devices 210 on the substrate 204, while other metal features are dummy structures that aid in bonding but which are electrically floating or disconnected from the semiconductor devices 210 on the substrate 204. Also, some metal features (e.g., a metal feature 238) of the bonding structure 228 may be electrically coupled to the semiconductor devices 230 on the substrate 224, while other metal features are dummy structures that aid in bonding but which are electrically floating or disconnected from the semiconductor devices 230 on the substrate 224. The metal features of the bonding structure 208 and the metal features of the bonding structure 228 are also referred to as bonding pads.

Figure 4:
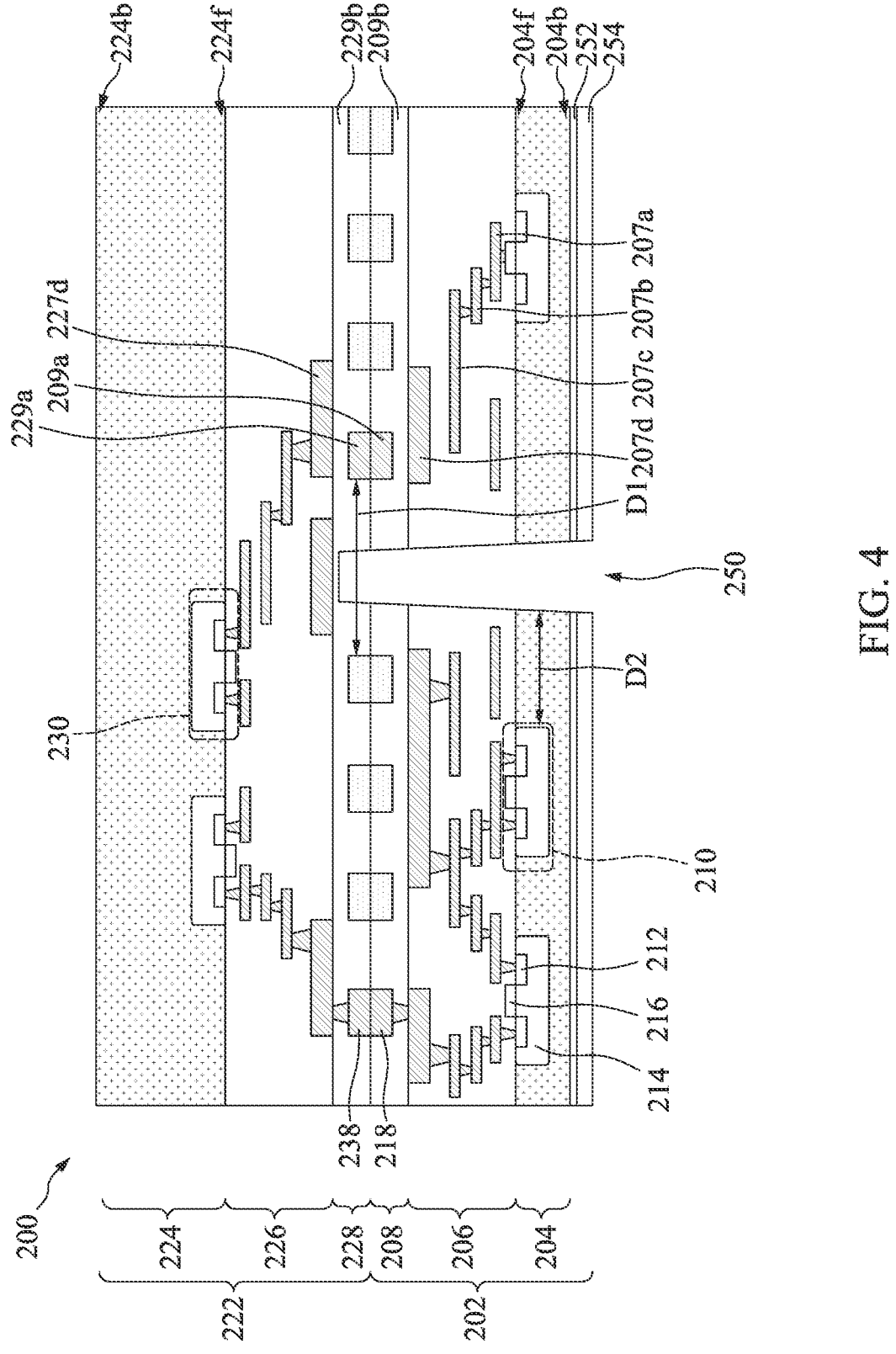

Referring to FIG. 4, a trench 250 penetrating through the substrate 204 and the interconnection structure 206 is formed. The respective step is shown as the operation 106 of the method 100 in FIG. 1. The trench 250 may be formed by spinning a photoresist solution on the back side of the substrate 204, baking the photoresist, exposing the photoresist to light through a reticle or photomask, and developing the exposed photoresist to form a patterned mask on the back side of the substrate 204. Next, with the patterned mask in place, an etch is carried out. The etch can be a wet etch or a dry etch. In other embodiments, extreme ultra-violet (UV) photolithography and/or electron beam lithography techniques may be used to form the trench 250.

In some embodiments, the trench 250 penetrates a space where no bonding pad is present. In other words, neither the metal features of the bonding structure 208 nor the metal features of the bonding structure 228 are located in the space. In some embodiments, a distance D1 between adjacent metal features of the bonding structure 208 or 228 is substantially in a range between about 0.1 μm and about 500 μm. If the distance D1 between adjacent metal features of the bonding structure 208 or 228 is greater than 500 μm, a concern may arise concerning formation of bubbles in the bonding between the first die 202 and the second die 222.

In some embodiments, the trench 250 exposes a portion of the second die 222. For example, the trench 250 exposes the dielectric layer 229b of the bonding structure 228. Alternatively, the trench 250 exposes an ILD layer (e.g., the ILD layer 225c) of the interconnection structure 226. In some embodiments, the trench 250 exposes an etch stop layer between adjacent ILD layers (e.g., the etch stop layer between the ILD layer 225c and the ILD layer 225d). In other embodiments, the trench 250 exposes a metal line (e.g., the topmost metal line 227d) of the interconnection structure 226. In some embodiments, a distance D2 between the trench 250 and the semiconductor device 210 is greater than or substantially equal to about 0.1 μm. If the distance D2 between the trench 250 and the semiconductor device 210 is less than 0.1 μm, the semiconductor device 210 may have leakage concern due to a stress impact of the capacitor structure (shown in FIG. 10) to be formed.

In some embodiments, prior to the formation of the trench 250, a thinning operation is performed to reduce a thickness of the substrate 204. In some embodiments, the thinning operation comprises a chemical mechanical polish (CMP), a grinding, and/or an etch back. In some embodiments, after the substrate 204 is thinned, one or more back-side dielectric layers 252 and 254 are formed over the back-side surface 204b of the substrate 204. The back-side dielectric layers 252 and 254 may be configured to advantageously repair damage to the substrate 204 caused by the thinning operation and/or to protect the substrate 204 during the formation of the trench 250. The back-side dielectric layers 252 and 254 may, for example, be formed by vapor deposition, thermal oxidation, or some other growth or deposition process. The back-side dielectric layers 252 and 254 may be formed of different materials. In some embodiments, the back-side dielectric layer 252 is made of a high-k dielectric material, and the back-side dielectric layer 254 is made of an oxide material. In some embodiments, the operation for forming the trench 250 comprises performing a selective etch through the back-side dielectric layers 252 and 254, the substrate 204, the interconnection structure 206, and the bonding structure 208, into the dielectric layer 229b, and stopping at the etch stop layer of the dielectric layer 229b between the dielectric material layers of the dielectric layer 229b.

Figure 5:
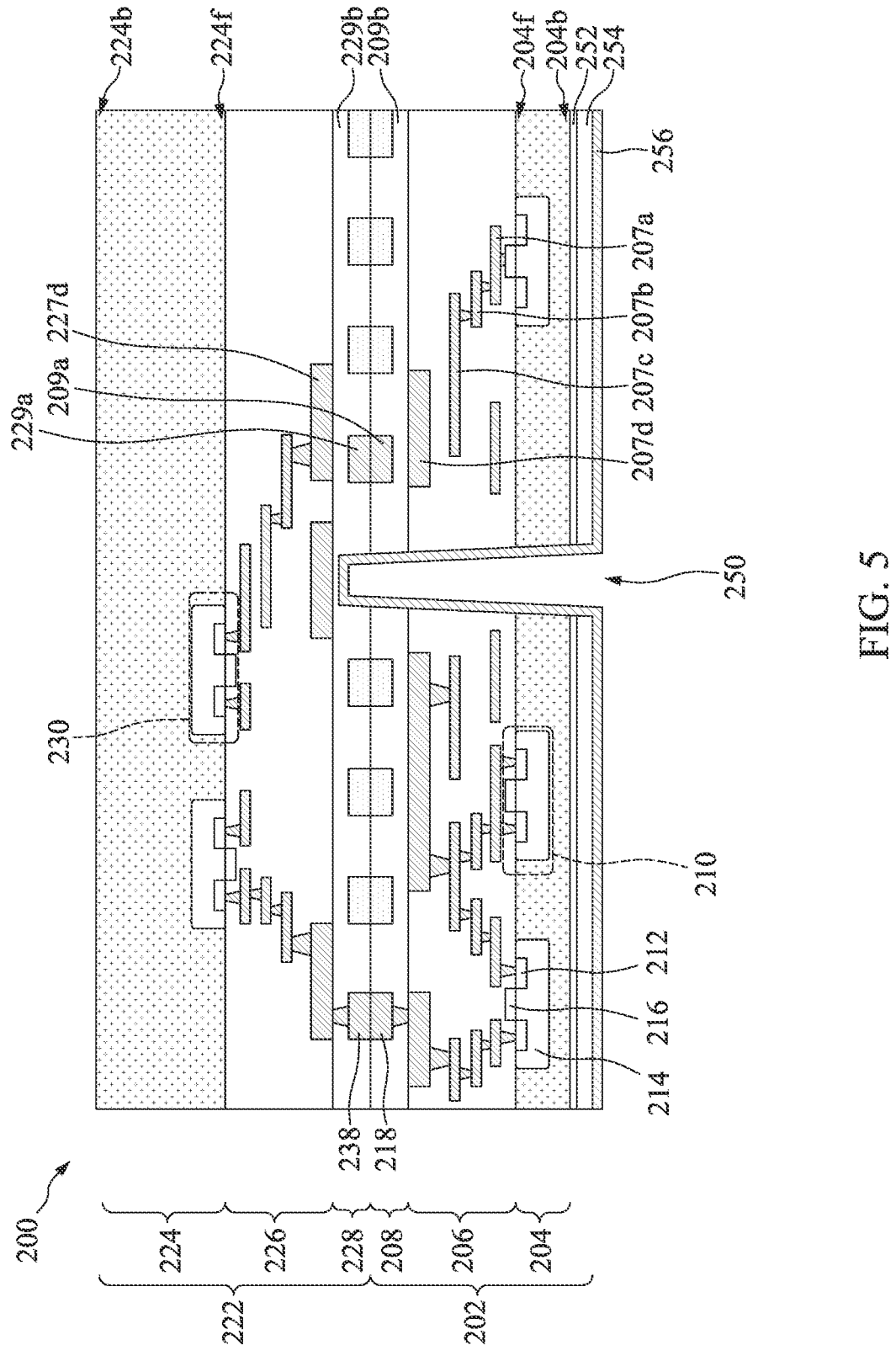

Referring to FIG. 5, in some embodiments, a liner 256 is formed in the trench 250 lining a sidewall of the substrate 204. The liner 256 lines an innermost surface and sidewalls of the trench 250. The liner 256 lines inner sidewalls of the substrate 204 in the trench 250, inner sidewalls of the interconnection structure 206 in the trench 250, inner sidewalls of the bonding structure 208 in the trench 250, inner sidewalls of the bonding structure 228 in the trench 250, and extends over the back-side surface 204*b* of the substrate 204 outside of the trench 250. The liner 256 may be configured to protect the substrate 204 and separate the substrate 204 from a capacitor structure to be formed. The liner 256 may be formed by physical vapor deposition (PVD), chemical vapor deposition (CVD), atomic layer deposition (ALD), thermal oxidation, or other suitable processes. In some embodiments, the liner 256 is a conformal layer. In some embodiments, the liner 256 is made of an oxide material.

Figure 6:
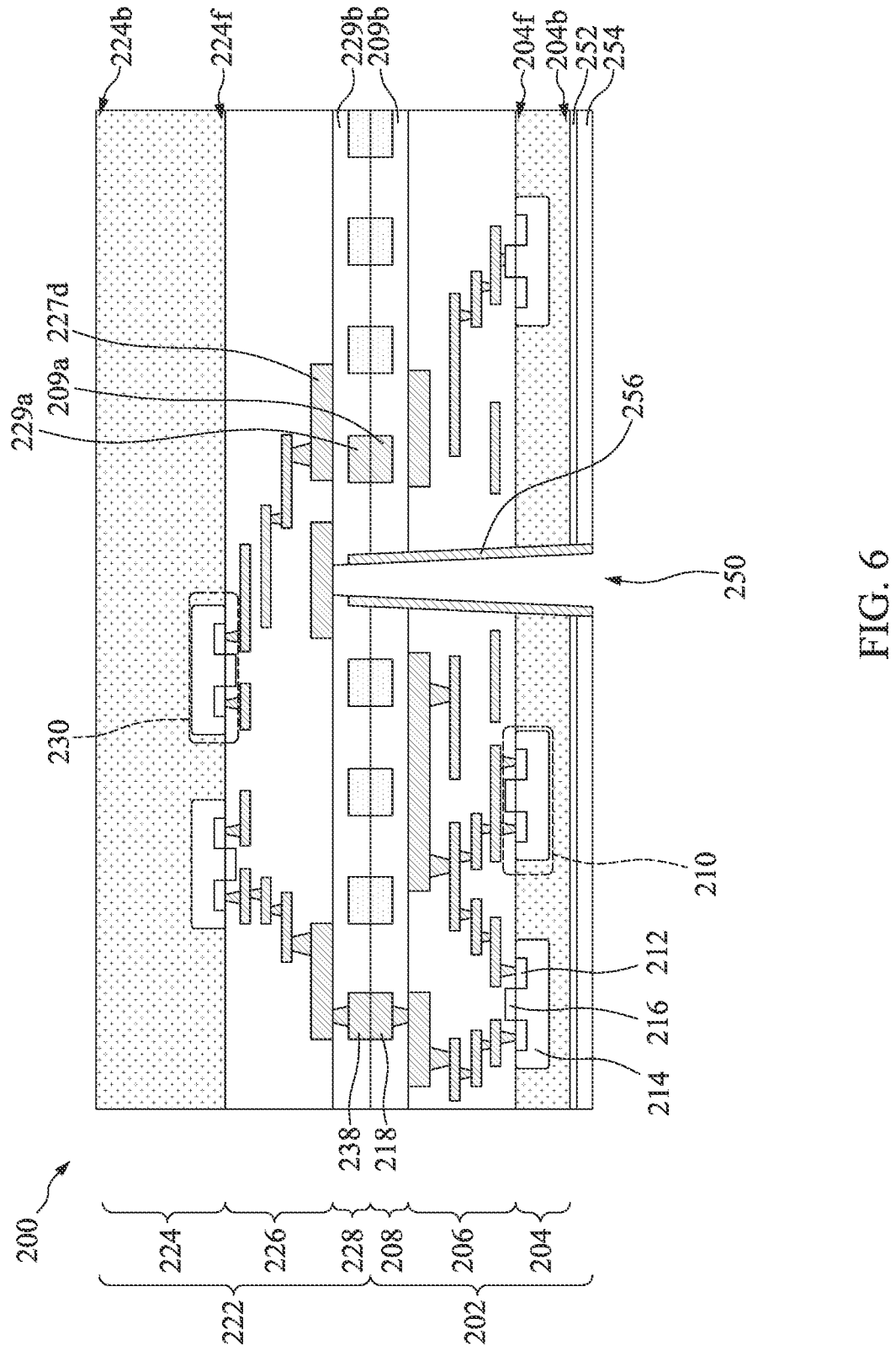

Referring to FIG. 6, in some embodiments, an etch operation is performed to selectively remove a portion of the liner 256 at the bottom of the trench 250 and a portion of the liner 256 on the surface of the back-side dielectric layer 254. In some embodiments, the etch operation stops at the topmost metal line 227*d* of the interconnection structure 226. In some embodiments, a depth of the trench 250 is increased by the etch operation. The etch operation may be performed using, for example, a blanket etch operation.

Figure 7:
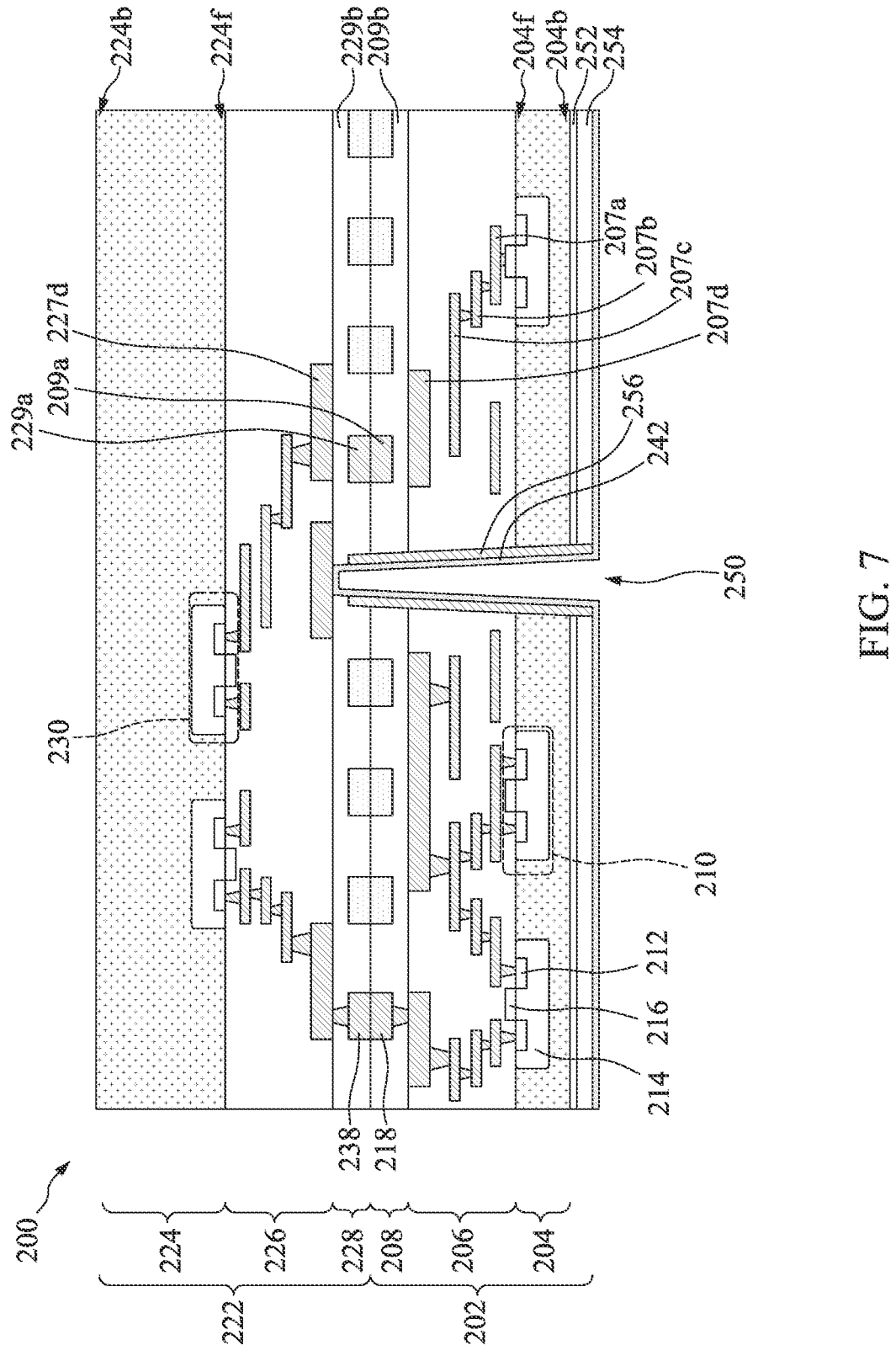

FIGS. 7 to 10 illustrate a formation of a capacitor structure 240 in the trench 250. The respective step is shown as the operation 108 of the method 100 in FIG. 1. Referring to FIG. 7, a conductive layer 242 is formed over the liner 256. The conductive layer 242 lines an innermost surface and sidewalls of the trench 250. The conductive layer 242 may be formed on the topmost metal line 227*d* and is electrically connected to the topmost metal line 227*d*. The conductive layer 242 further lines inner sidewalls of the dielectric layer 229*b* of the bonding structure 228 in the trench 250, lines inner sidewalls of the liner 256 in the trench 250, and extends over a surface of the back-side dielectric layer 254 on the back side of the substrate 204 outside of the trench 250. The conductive layer 242 may be configured as a capacitor electrode. The conductive layer 242 may be formed by PVD, CVD, ALD, sputtering, or electroplating. In some embodiments, the conductive layer 242 is a conformal layer. In some embodiments, the conductive layer 242 includes metals or doped polysilicon. For example, the metals may include copper, aluminum, tungsten, nickel, titanium, and/or zirconium.

Figure 8:
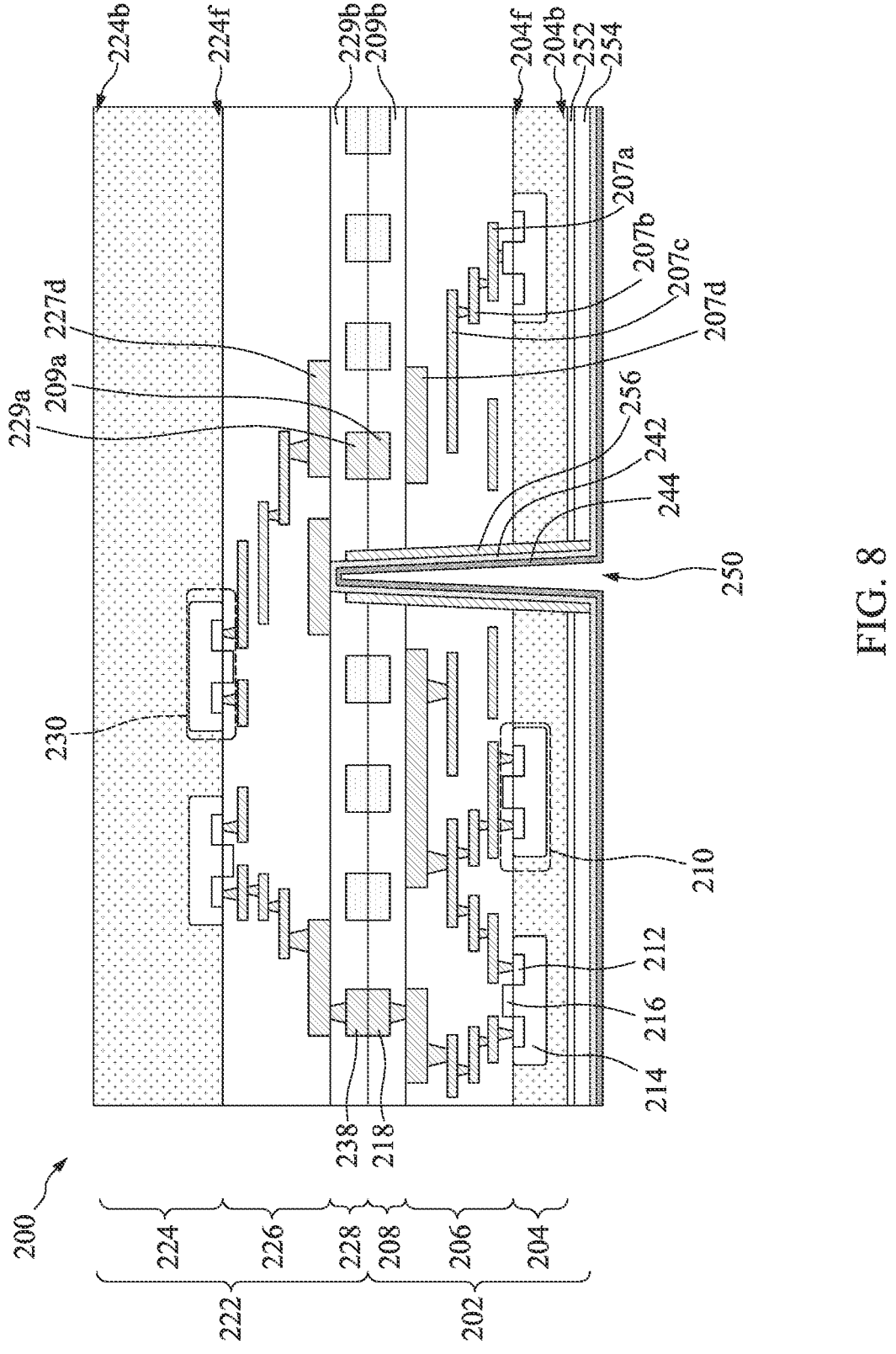

Referring to FIG. 8, a dielectric layer 244 is formed over the conductive layer 242. The dielectric layer 244 lines an innermost surface and sidewalls of the conductive layer 242 in the trench 250, and extends over a surface of the conductive layer 242 on the back side of the substrate 204 outside of the trench 250. In some embodiments, the dielectric layer 244 is a conformal layer. The dielectric layer 244 may be formed by PVD, CVD, ALD, or thermal oxidation. In some embodiments, the dielectric layer 244 may comprise a high-k dielectric material comprising hafnium and/or zirconium, and can take a form of hafnium silicate, zirconium silicate, hafnium dioxide and/or zirconium dioxide.

Figure 9:
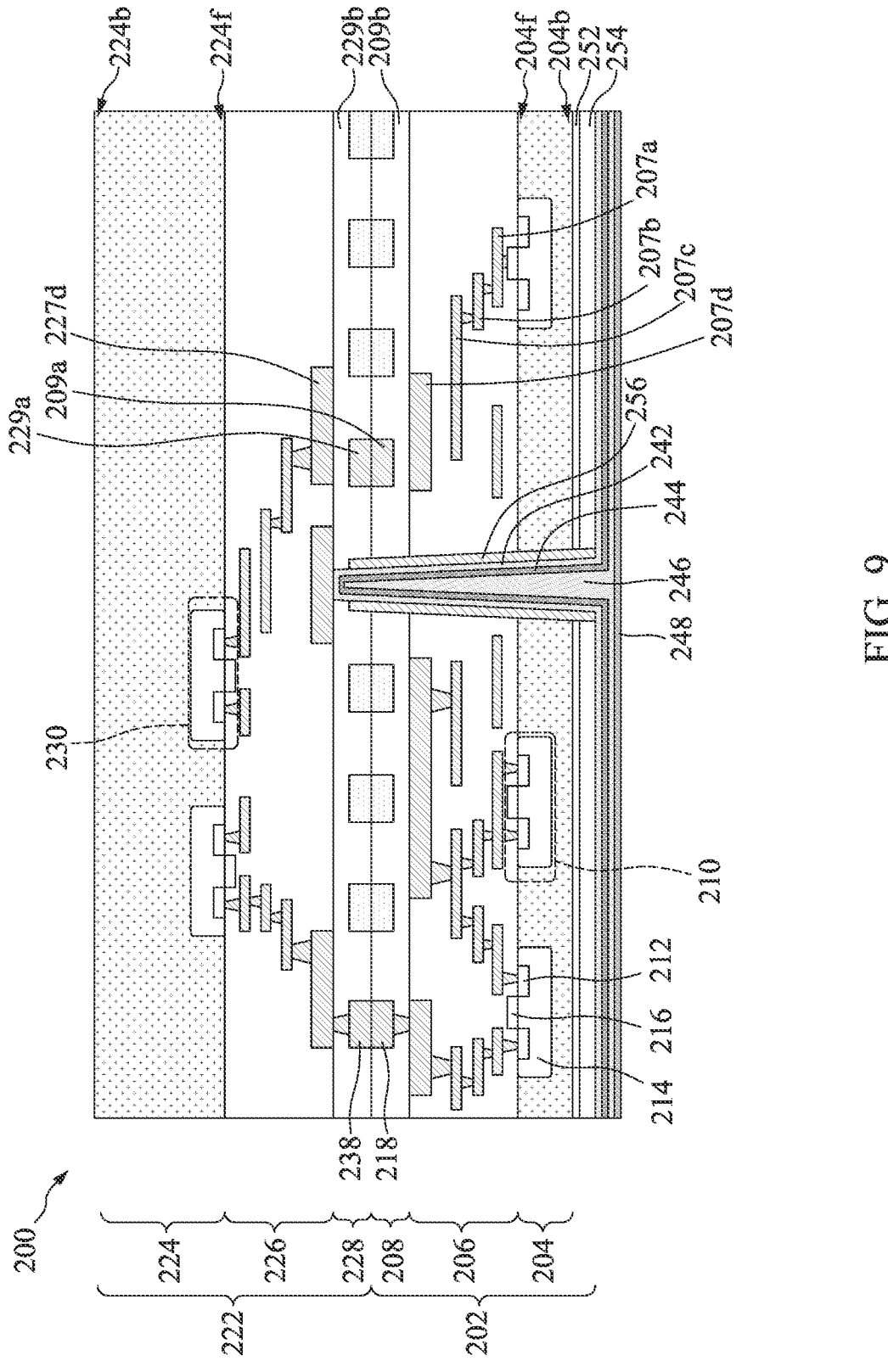

Referring to FIG. 9, a conductive layer 246 is next formed over the dielectric layer 244. The conductive layer 246 may fill the trench 250 and extends over a surface of the dielectric layer 244 on the back side of the substrate 204 outside of the trench 250. The conductive layer 246 may be formed by PVD, CVD, ALD, sputtering, or electroplating. The conductive layer 246 may be configured as a capacitor electrode. In some embodiments, the conductive layer 246 includes metals or doped polysilicon. For example, the metals may include copper, aluminum, tungsten, nickel, titanium, and/or zirconium. In some embodiments, a chemical mechanical planarization (CMP) operation is performed. In the illustrated embodiments, the CMP operation planarizes an upper surface of the conductive layer 246.

Still referring to FIG. 9, a dielectric layer 248 is formed over the conductive layer 246. The dielectric layer 248 extends over a surface of the conductive layer 246 on the back side of the substrate 204 outside of the trench 250. In some embodiments, the dielectric layer 248 is a conformal layer. The dielectric layer 248 may be formed by PVD, CVD, ALD, or thermal oxidation. In some embodiments, the dielectric layer 248 may comprise a high-k dielectric material comprising hafnium and/or zirconium, and can take a form of hafnium silicate, zirconium silicate, hafnium dioxide and/or zirconium dioxide.

Figure 10:
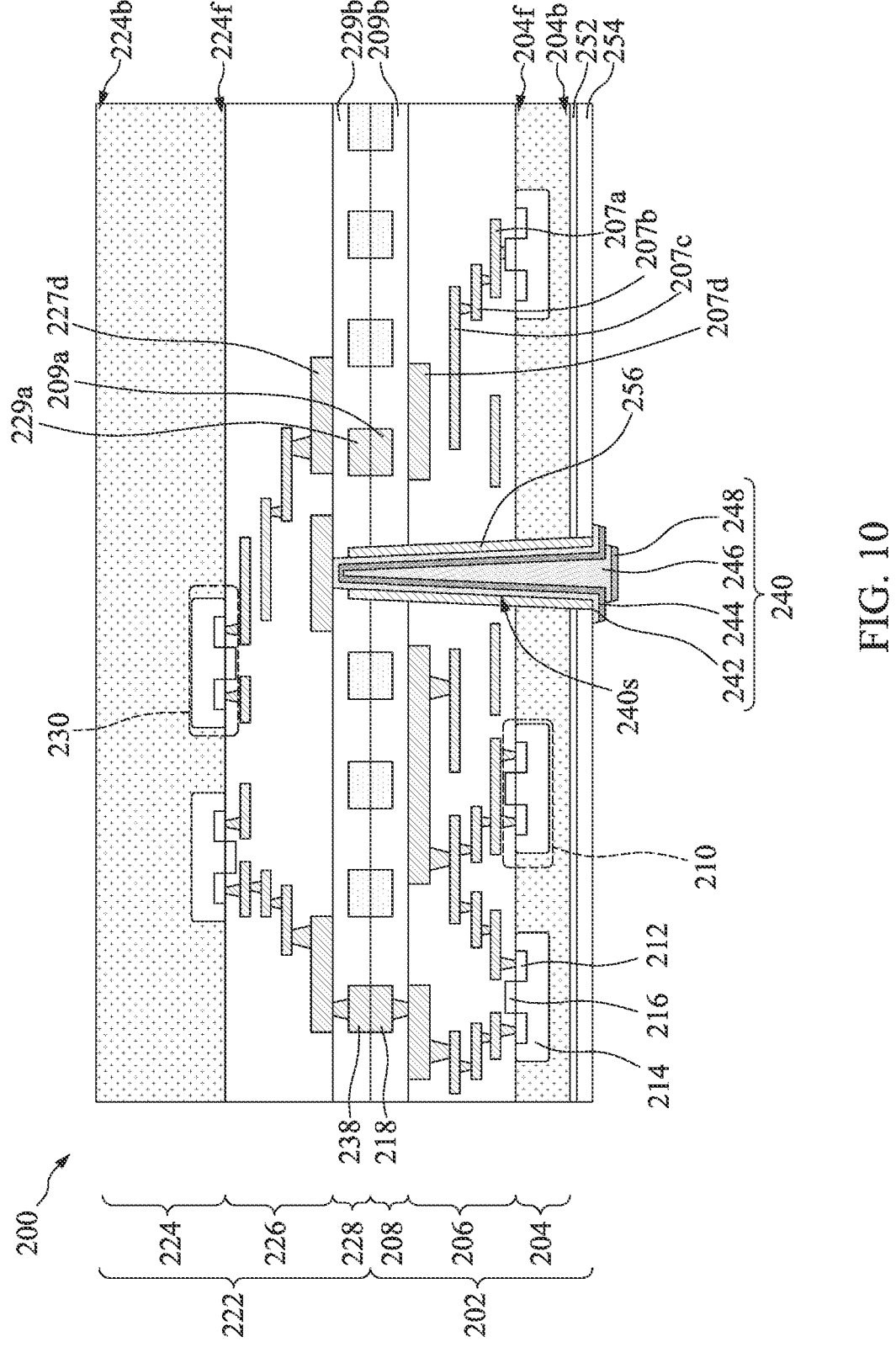

Referring to FIG. 10, in some embodiments, the dielectric layer 248 and the conductive layer 246 are patterned. Additionally, the dielectric layer 244 and the conductive layer 242 are patterned. The dielectric layer 248, the conductive layer 246, the dielectric layer 244 and the conductive layer 242 may be patterned in different operations. The dielectric layer 248, the conductive layer 246, the dielectric layer 244 and the conductive layer 242 may be patterned, for example, by forming a photomask and then performing an etch with the photomask in place. The photomask is then removed, for example by ashing or plasma stripping. Accordingly, the capacitor structure 240 including the conductive layers 242 and 246 and the dielectric layers 244 and 248 is formed. The capacitor structure 240 may extend continuously from the back-side surface 204*b* to the front-side surface 204*f*. The capacitor structure 240 further extends continuously from the interconnection structure 206 to the interconnection structure 226. The capacitor structure 240 further penetrates through the bonding structure 208. In some embodiments, the capacitor structure 240 further penetrates through the bonding structure 228. In alternative embodiments, the capacitor structure 240 extends through the bonding structure 208 and the bonding structure 228.

In some embodiments, the liner 256 is between the capacitor structure 240 and the substrate 204. The liner 256 may laterally surround the capacitor structure 240 and separates the capacitor structure 240 from the substrate 204. In some embodiments, the liner 256 lines a sidewall 240*s* of the capacitor structure 240. The liner 256 partially lines the sidewall 240*s* of the capacitor structure 240. Further, a portion of the sidewall 240*s* of the capacitor structure 240 is exposed through the liner 256 and contacts the bonding structure 228. For example, the portion of the sidewall 240*s* of the capacitor structure 240 contacts the dielectric layer 229*b* of the bonding structure 228. In alternative embodiments, the portion of the sidewall 240*s* of the capacitor structure 240 contacts an ILD layer of the interconnection structure 226.

Figure 11:
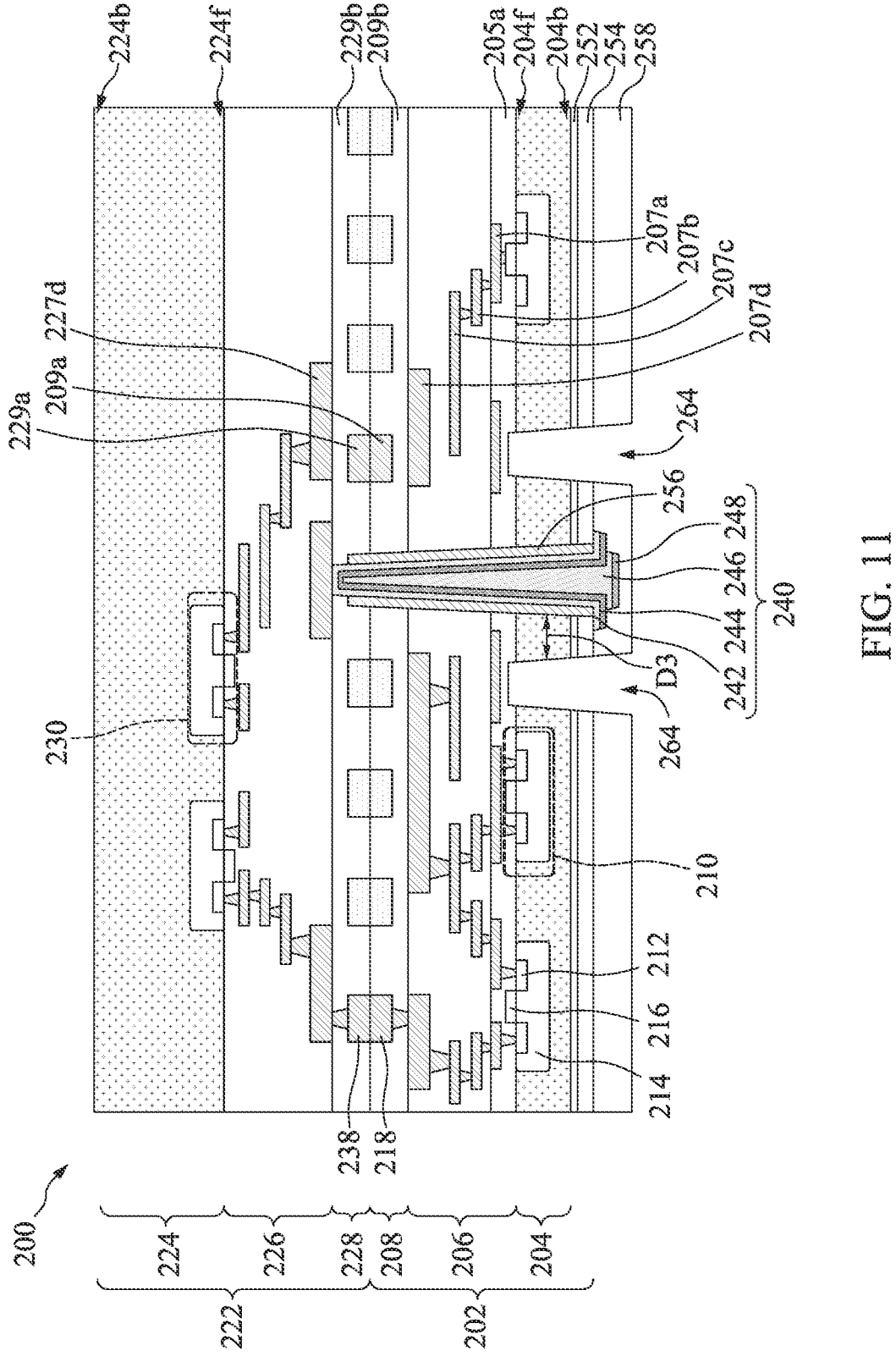

FIGS. 11 to 14 illustrate a formation of one or more through via structures (also referred to as through-substrate-vias (TSVs)) 260. Referring to FIG. 11, in some embodiments, after the dielectric layer 248, the conductive layer 246, the dielectric layer 244 and the conductive layer 242 are patterned, another back-side dielectric layer 258 is formed over the capacitor structure 240. The back-side dielectric layer 258 may be formed of materials and by operations similar to those of the back-side dielectric layer 254. In some embodiments, the back-side dielectric layer 258 is formed to cover the capacitor structure 240.

One or more trenches 264 penetrating through the back-side surface 204*b* and the front-side surface 204*f* are formed. The trenches 264 may be formed by operations similar to those for forming the trench 250. In some embodiments, the trench 264 exposes a portion of the interconnection structure 206. For example, the trench 264 exposes an ILD layer (e.g., the ILD layer 205a) of the interconnection structure 206. In other embodiments, the trench 264 exposes a metal line (e.g., the first metal line 207a) of the interconnection structure 206. In some embodiments, a distance D3 between the trench 264 and the capacitor structure 240 is greater than or substantially equal to about 0.5 μm. If the distance D3 between the trench 264 and the capacitor structure 240 is less than 0.5 μm, there may be a risk of the capacitor structure 240 breaking down due to a stress impact.

Figure 12:
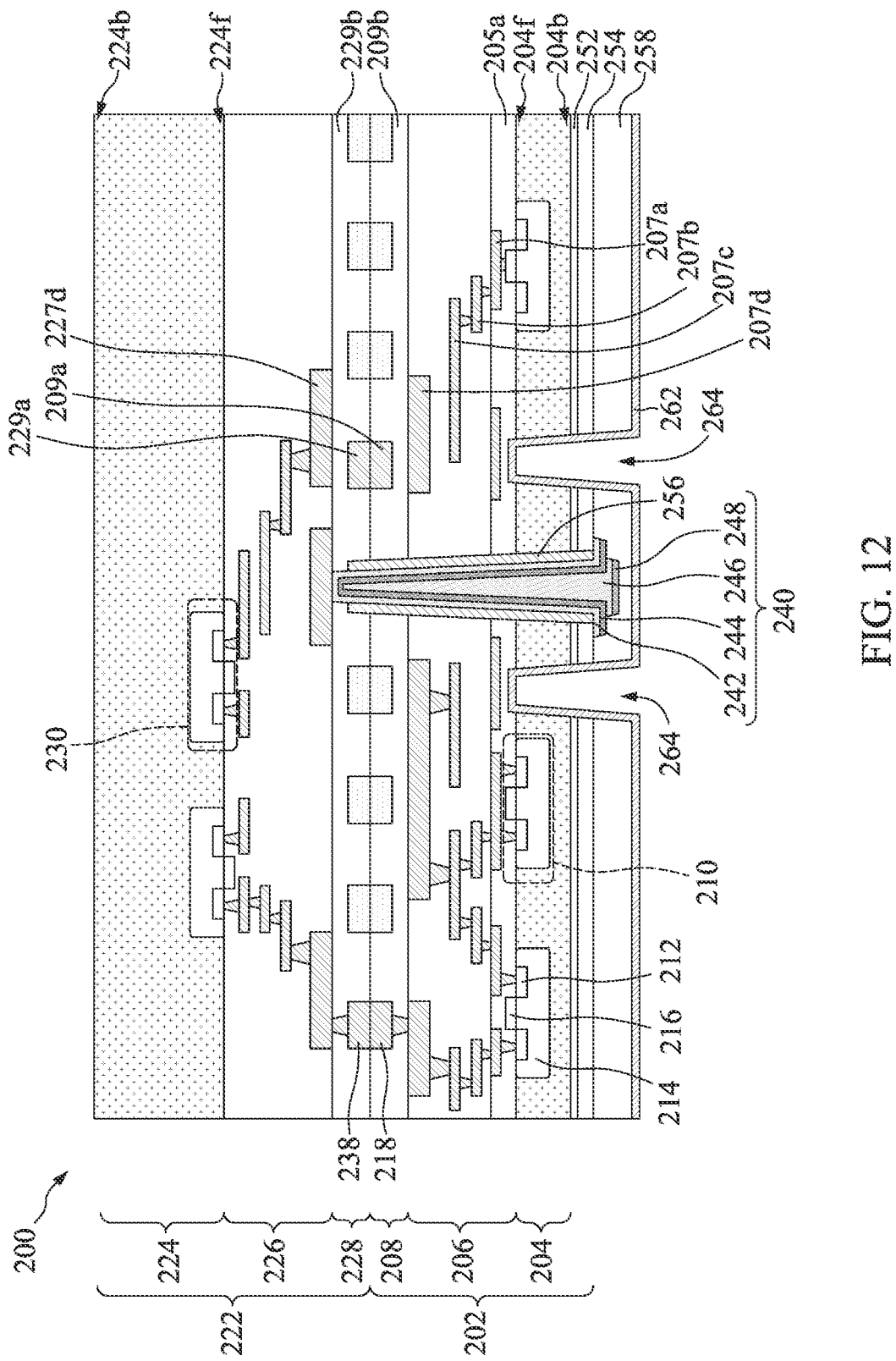

Referring to FIG. 12, in some embodiments, a liner 262 is formed in the trench 264 lining a sidewall of the substrate 204. The liner 262 lines an innermost surface and sidewalls of the trench 264. The liner 262 lines inner sidewalls of the substrate 204 in the trench 264, and extends over a surface of the back-side dielectric layer 258 outside of the trench 264. The liner 262 may be configured to protect the substrate 204 and separate the substrate 204 from the TSVs to be formed. The liner 262 may be formed by physical vapor deposition (PVD), chemical vapor deposition (CVD), atomic layer deposition (ALD), thermal oxidation, or other suitable processes. In some embodiments, the liner 262 is a conformal layer. In some embodiments, the liner 262 is made of an oxide material.

Figure 13:
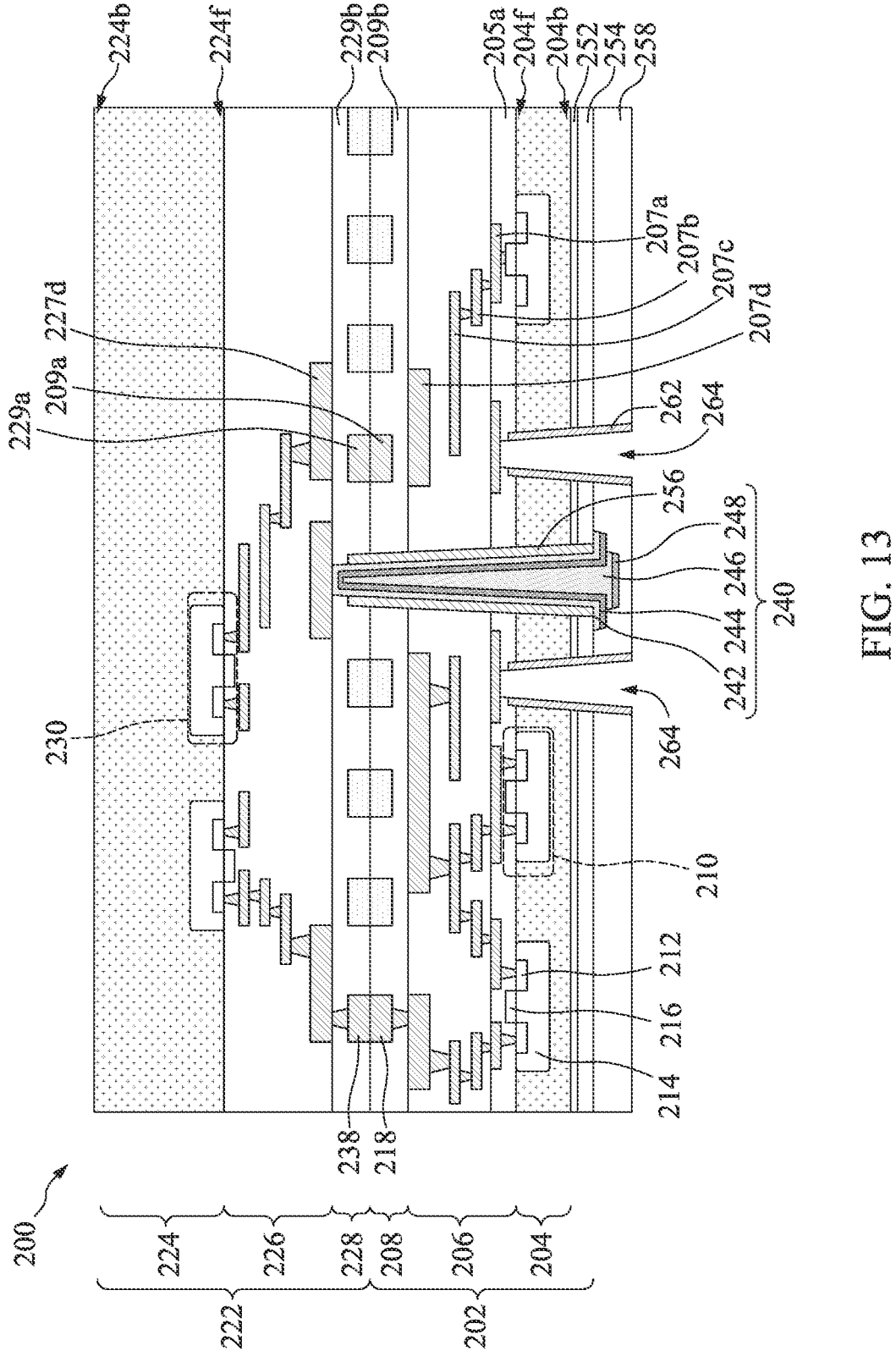

Referring to FIG. 13, in some embodiments, an etch operation is performed to selectively remove a portion of the liner 262 at a bottom of the trench 264 and a portion of the liner 262 on the surface of the back-side dielectric layer 258. In some embodiments, the etch operation stops at the first metal line 207a of the interconnection structure 206. In some embodiments, a depth of the trench 264 is increased by the etch operation. The etch operation may be performed using, for example, a blanket etch operation.

Figure 14:
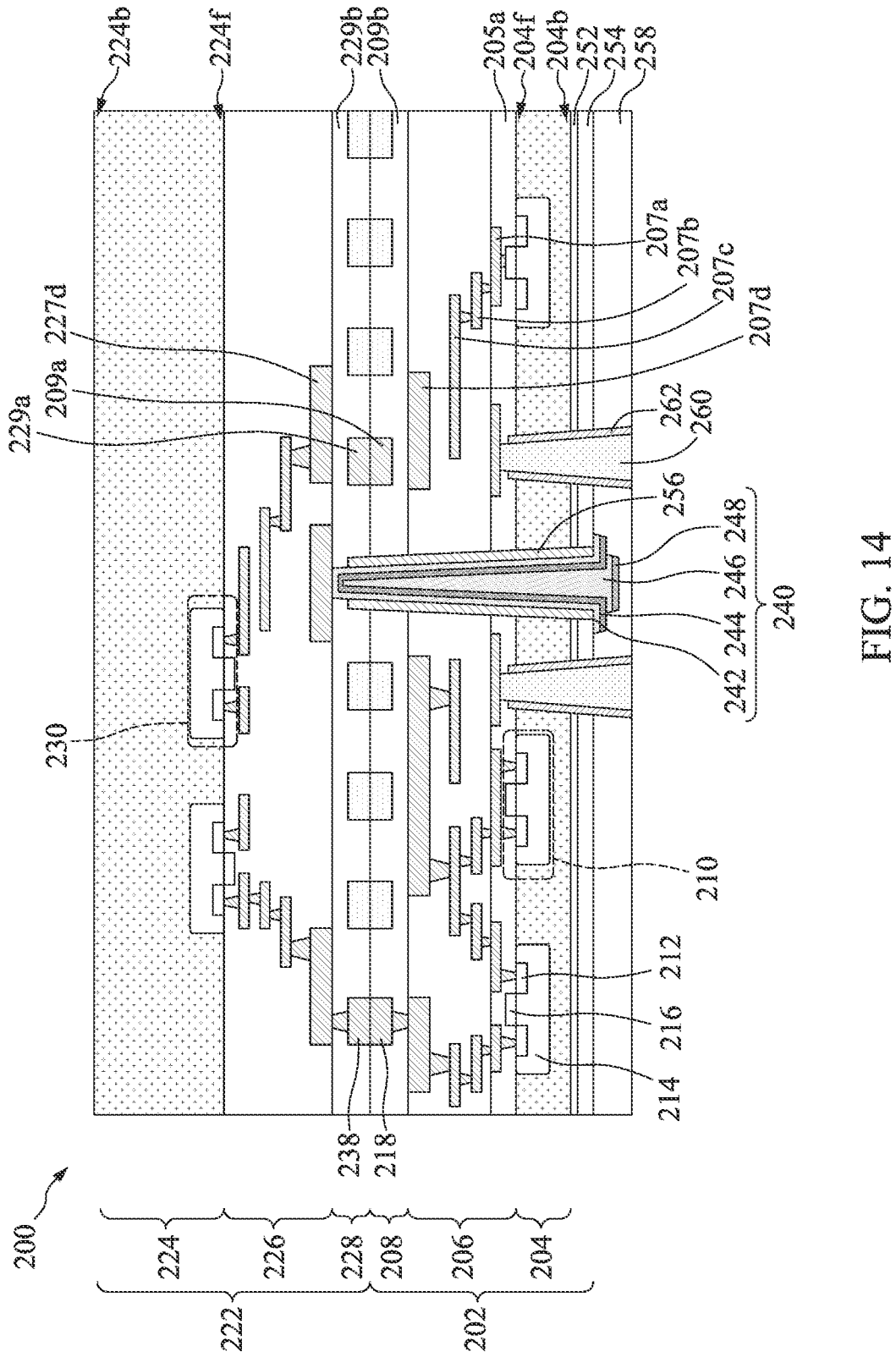

Referring to FIG. 14, in some embodiments, a conductive layer (not shown) is next formed over the liner 262. The conductive layer may fill the trench 264 and extends over the surface of the back-side dielectric layer 258 on the back side of the substrate 204 outside of the trench 264. The conductive layer may be formed by PVD, CVD, ALD, sputtering, or electroplating. In some embodiments, a CMP operation is performed next. In the illustrated embodiments, the CMP operation planarizes an upper surface of the conductive layer until the upper surface is coplanar with the surface of the back-side dielectric layer 258. Accordingly, one or more TSVs 260 are formed. In some embodiments, the TSV 260 comprises copper or a copper alloy. The TSV 260 may have sidewalls that are lined with a barrier layer (not shown) comprising tantalum or titanium for example. In some embodiments, the TSVs 260 laterally surrounds the capacitor structure 240.

Figure 15:
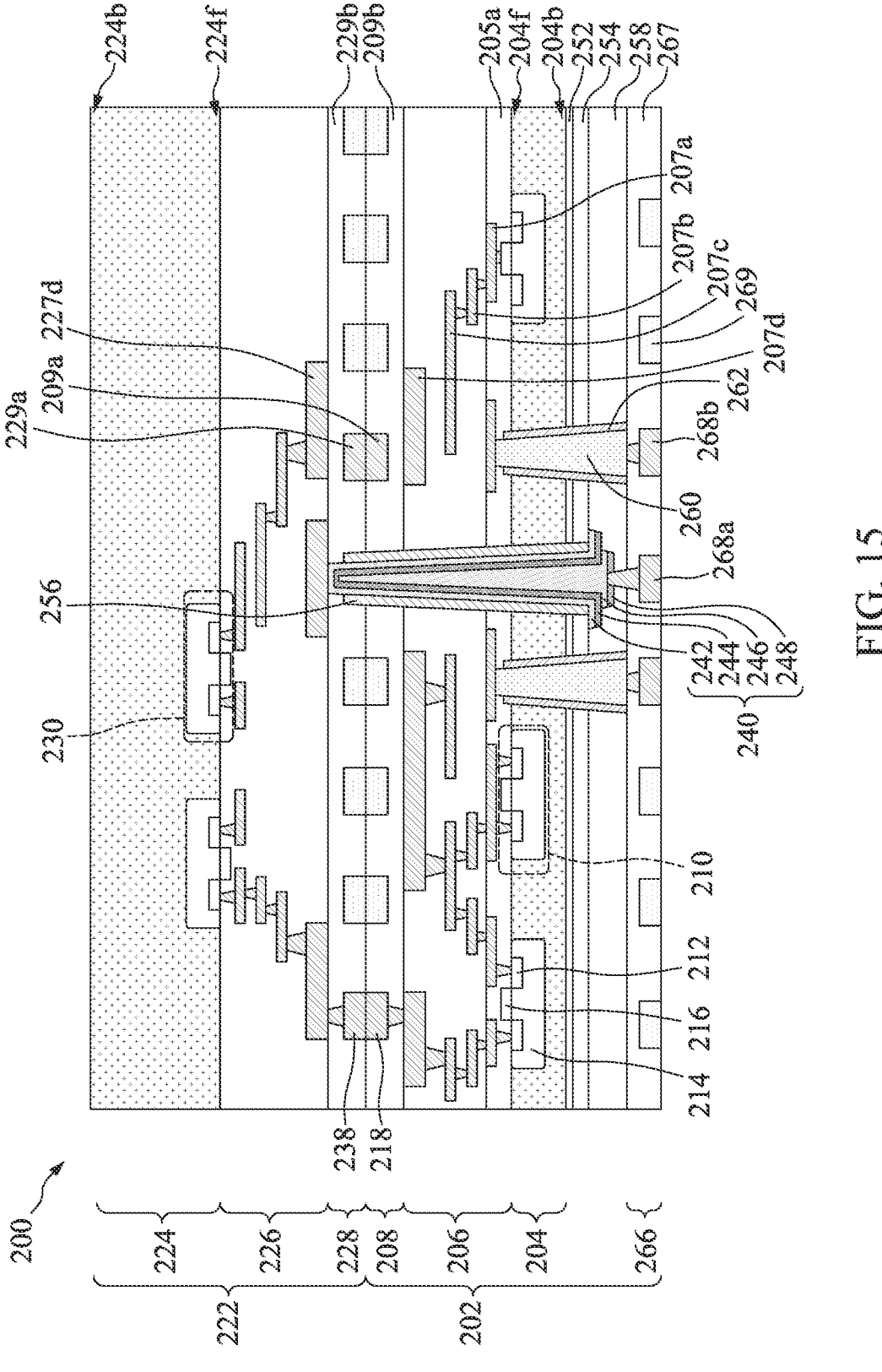

Referring to FIG. 15, in some embodiments, a bonding structure 266 is formed. The bonding structure 266 is disposed on the back-side dielectric layer 258. The bonding structure 266 may be referred to as a back-side interconnection structure. The bonding structure 266 may be formed, for example, by forming a dielectric layer 267 over the planarized upper surface of FIG. 14, and then using photolithography to form via openings and pad openings in the dielectric layer 267. Conductive material, which may comprise tungsten, aluminum, and/or copper for example, may be formed in the via openings and pad openings, and may then be planarized to establish metal features 268a, 268b and 269. In some embodiments, some of the metal features 268a of the bonding structure 266 may be electrically coupled to the capacitor structure 240. Additionally, some of the metal features 268a of the bonding structure 266 may be electrically coupled to the TSV 260. In some embodiments, the metal features 269 are configured as dummy structures that aid in bonding but which are electrically floating or disconnected from the capacitor structure 240 or the TSV 260. The metal features 268a, 268b and 269 of the bonding structure 266 are also referred to as bonding pads.

Figure 16:
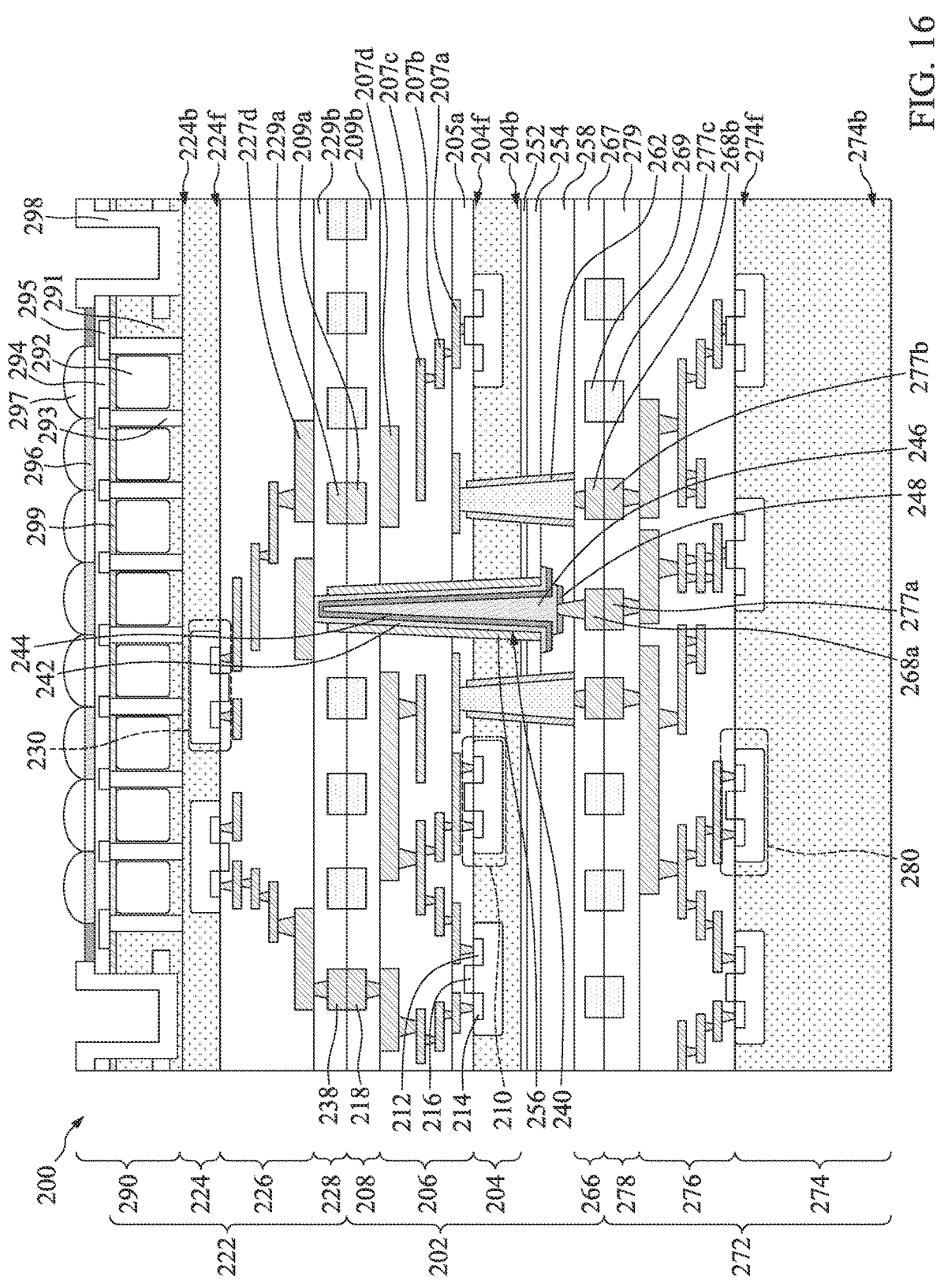

Referring to FIG. 16, in some embodiments, a third die 272 is bonded to the first die 202. The third die 272 may include a substrate 274 having a front-side surface 274f and a back-side surface 274b. The substrate 274 is disposed over the substrate 204. The front-side surface 274f of the substrate 274 faces the back-side surface 204b of the substrate 204. The third die 272 may include an interconnection structure 276 disposed over the front-side surface 274f of the substrate 274. The interconnection structure 276 is disposed between the front-side surface 274f of the substrate 274 and the back-side surface 204b of the substrate 204. The interconnection structure 276 includes a plurality of metal lines and metal vias that operably couple semiconductor devices 280 disposed in or on the front-side surface 274f of the substrate 274 to one another. In some embodiments, the TSV 260 electrically couples the interconnection structure 276 to the interconnection structure 206. Many aspects of the substrate 274 and the interconnection structure 276 are similar to those of the substrate 204 and the interconnection structure 206, and repeated descriptions thereof are omitted for brevity.

In some embodiments, a bonding structure 278 is formed to bond the third die 272 to the first die 202. The bonding structure 278 is disposed on the interconnection structure 276 and is bonded to the bonding structure 266. The bonding structure 278 corresponds to the bonding structure 266 and is bonded to the bonding structure 266. In some embodiments, the bonding structure 278 includes conductive features (e.g., metal features 277a, 277b and 277c) disposed in a dielectric layer 279. Further, some metal features (e.g., the metal features 277a and 277b) of the bonding structure 278 may be electrically coupled to the semiconductor devices 280 on the substrate 274, while other metal features (e.g., the metal feature 277c) are dummy structures that aid in bonding but are electrically floating or disconnected from the semiconductor devices 280 on the substrate 274. In some embodiments, some metal features (e.g., the metal feature 277a) of the bonding structure 278 may be electrically coupled to the capacitor structure 240 of the first die 202. The metal features 277a, 277b and 277c of the bonding structure 278 are also referred to as bonding pads.

In some embodiments, the conductive layer 242 of the capacitor structure 240 is configured as a bottom capacitor electrode and is electrically coupled to the topmost metal line 227d of the interconnection structure 226 in the second die 222. Further, the conductive layer 246 of the capacitor structure 240 is configured as an upper capacitor electrode and is electrically coupled to the metal feature 268a of the bonding structure 266 in the first die 202. The conductive layer 246 is further electrically coupled to the metal feature 277a of the bonding structure 278 in the third die 272 and/or the metal lines and metal vias of the interconnection structure 276. In some embodiments, the capacitor structure 240 is electrically coupled to the semiconductor device 280 through the metal lines and metal vias of the interconnection structure 276. Alternatively, the capacitor structure 240 is electrically coupled to the semiconductor device 230 through the metal lines and metal vias of the interconnection structure 226.

In some embodiments, after the third die 272 is bonded to the first die 202, a thinning operation is performed to reduce a thickness of the substrate 224 of the second die 222. In some embodiments, after the substrate 224 is thinned, an image sensor structure 290 may be formed over the back-side surface 224b of the substrate 224. The image sensor structure 290 may be a back-side illumination (BSI) image sensor structure. In some embodiments, doped regions and/or a negatively-charged film are formed on the back-side surface 224b to repair defects formed during the thinning of the substrate 224.

In some embodiments, the image sensor structure 290 including light-sensing regions 292 formed in a substrate 291 is provided. In some embodiments, isolation structures 293 are disposed in the substrate 291 and separate the light-sensing regions 292 from one another. Alternatively or additionally, a passivation layer 299 is disposed over the substrate 291. In some embodiments, optical elements are then formed on the light-sensing regions 292 to guide light into the light-sensing regions 292. In some embodiments, a reflective grid 295 and a dielectric layer 294 are formed over the substrate 291. The reflective grid 295 may be a metal grid that is used to reflect light into the light-sensing regions 292. In some embodiments, a color filter film 296 and microlenses 297 are formed over the light-sensing regions 292. Alternatively or additionally, one or more conductive pads 298 are formed. The conductive pad 298 is formed by etching an opening in the substrate 291 and at least partially filling the opening with a conductive material. The conductive material may include a metal or metal compound, such as AlCu. In some embodiments, due to the conductive pad 298, electrical connections may be established between the image sensor structure 290 and external devices.

The structures and methods of the present disclosure are not limited to the above-mentioned embodiments, and may have other different embodiments. To simplify the description and for the convenience of comparison between each of the embodiments of the present disclosure, identical (or like) numerical labels in different drawings indicate substantially identical (or like) components or equivalents thereof. For making it easier to compare differences between the embodiments, the following description will detail dissimilarities among different embodiments and identical features will not be redundantly described.

FIGS. 17 to 20 are schematic drawings illustrating a semiconductor structure 300 at various fabrication stages constructed according to aspects of the present disclosure in one or more embodiments. Many aspects of the semiconductor structure 300 are similar to those of the semiconductor structure 200, and repeated descriptions thereof are omitted for brevity.

Figure 17:
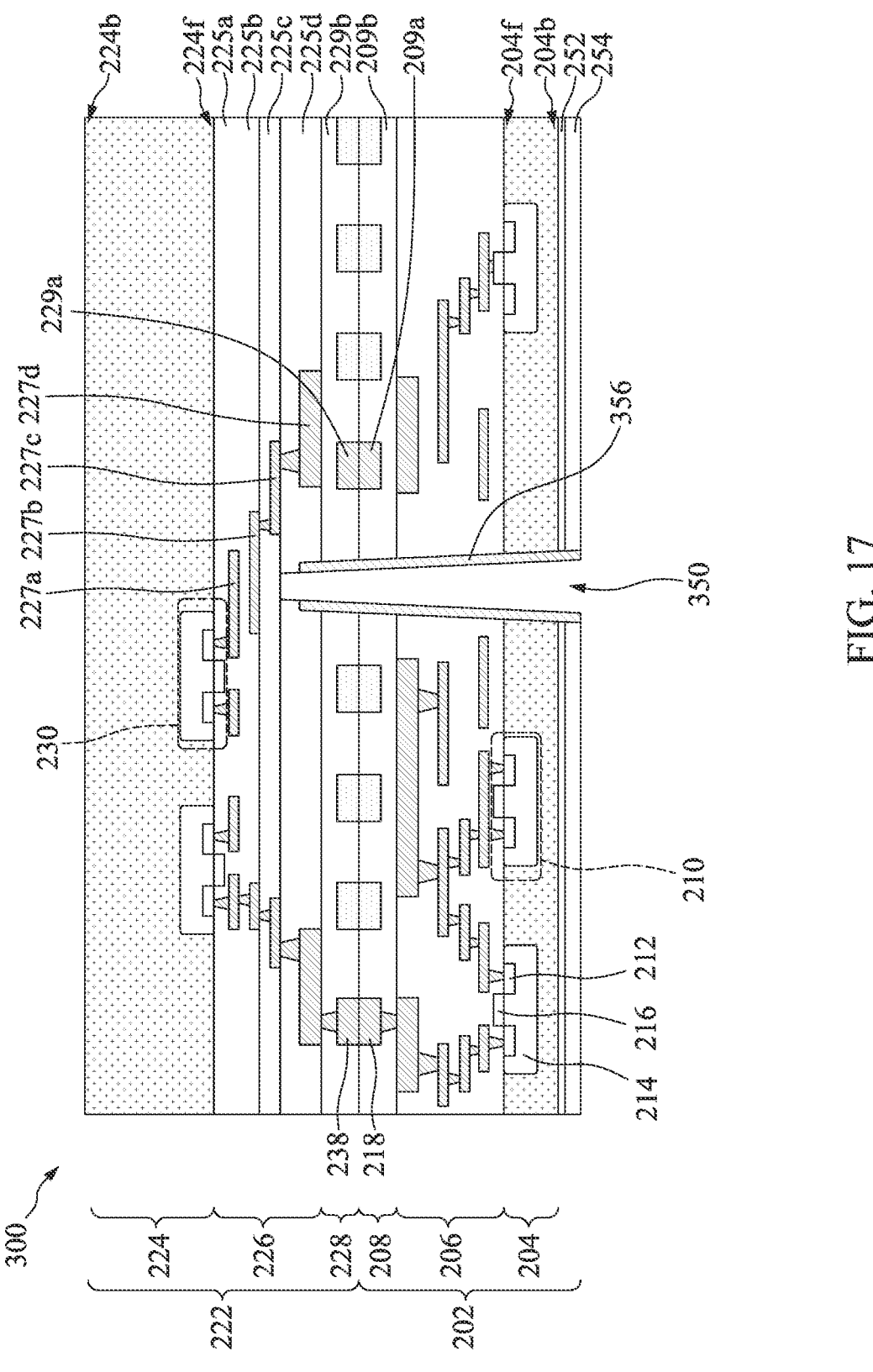
FIGS. 17 to 20 are schematic drawings illustrating a semiconductor structure at various fabrication stages constructed according to aspects of the present disclosure in one or more embodiments.

Referring to FIG. 17, operations similar to those illustrated in FIGS. 4 to 6 may be repeated to form a trench 350 penetrating through the substrate 204 and the interconnection structure 206 and a liner 356 lining a sidewall of the substrate 204. In some embodiments, the trench 350 exposes a portion of the interconnection structure 226. For example, the trench 350 exposes an ILD layer (e.g., the ILD layer 225c) of the interconnection structure 206. Alternatively, the trench 350 exposes an etch stop layer between adjacent ILD layers (e.g., the etch stop layer between the ILD layer 225c and the ILD layer 225d).

Figure 18:
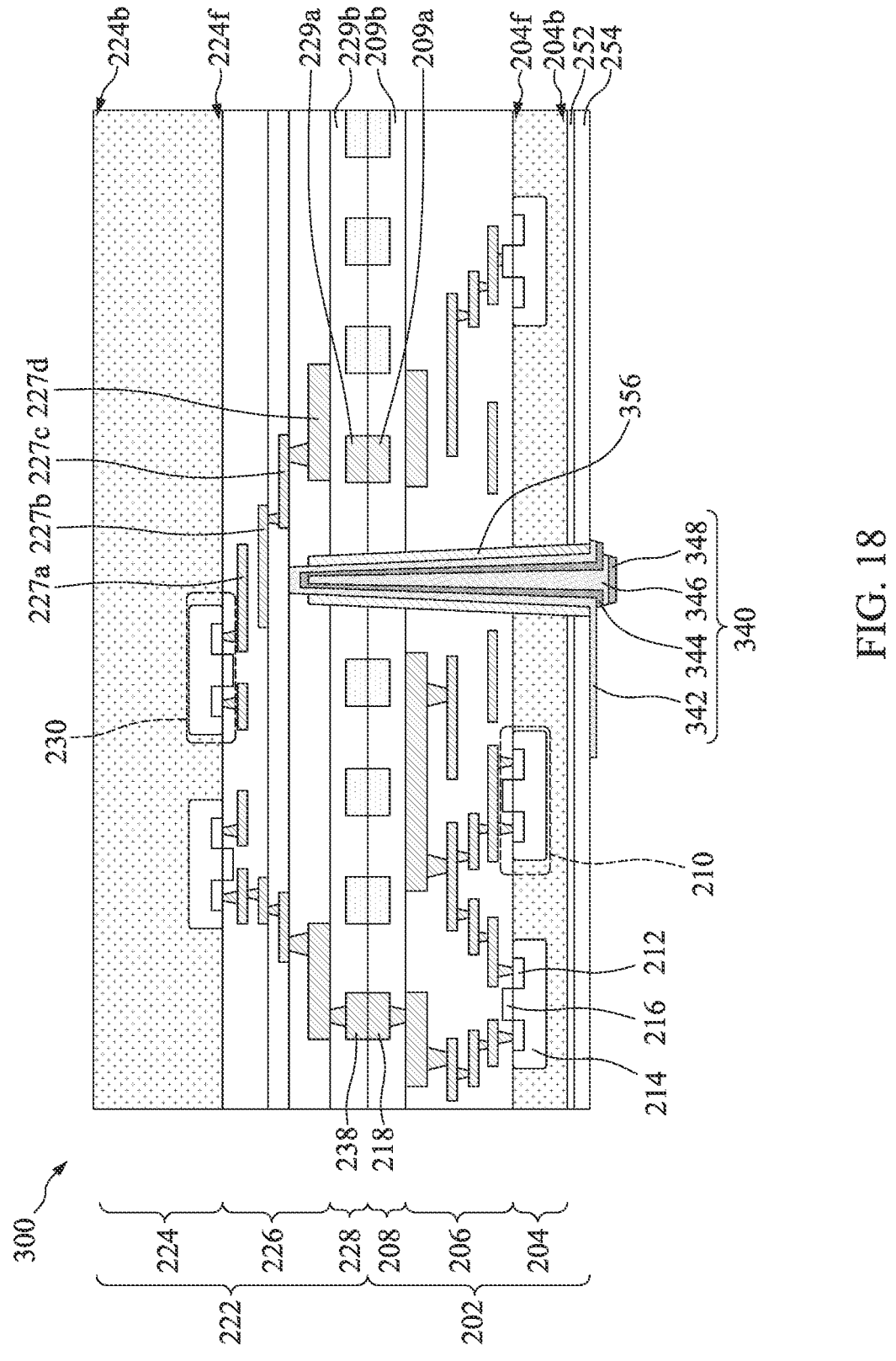

Referring to FIG. 18, operations similar to those illustrated in FIGS. 7 to 10 may be repeated to form a capacitor structure 340 in the trench 350. The capacitor structure 340 includes conductive layers 342, 346 and dielectric layers 344, 348. The dielectric layer 348, the conductive layer 346, the dielectric layer 344 and the conductive layer 342 may be patterned in different operations. In some embodiments, a portion of the conductive layer 342 is exposed through the dielectric layer 344 after the patterning operation.

Figure 19:
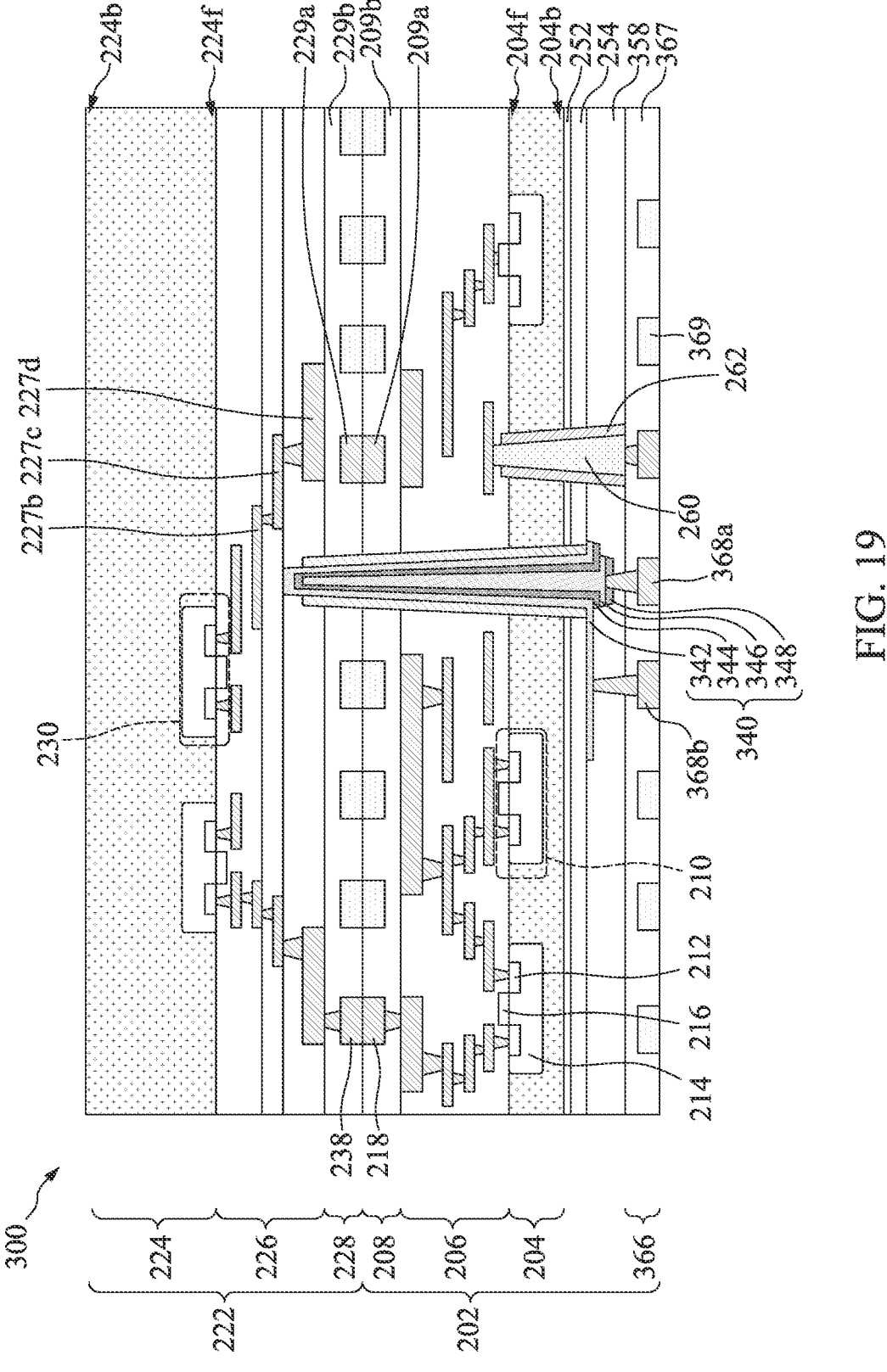

Referring to FIG. 19, operations similar to those illustrated in FIGS. 11 to 15 may be repeated to form a back-side dielectric layer 358 covering the capacitor structure 340, a TSV 260 adjacent to the capacitor structure 340 and a bonding structure 366 over the back-side dielectric layer 358. In some embodiments, the bonding structure 366 includes conductive features (e.g., metal features 368a, 368b and 369) disposed in a dielectric layer 367. Further, some metal features (e.g., the metal feature 368a) of the bonding structure 366 may be electrically coupled to the conductive layer 346 of the capacitor structure 340, while metal features (e.g., the metal feature 368b) of the bonding structure 366 may be electrically coupled to the conductive layer 342 of the capacitor structure 340. Additionally, other metal features (e.g., the metal feature 369) may be configured as dummy structures that aid in bonding but which are electrically floating or disconnected from the semiconductor devices 210 or the capacitor structure 340. The metal features 368a, 368b and 369 of the bonding structure 366 are also referred to as bonding pads.

Figure 20:
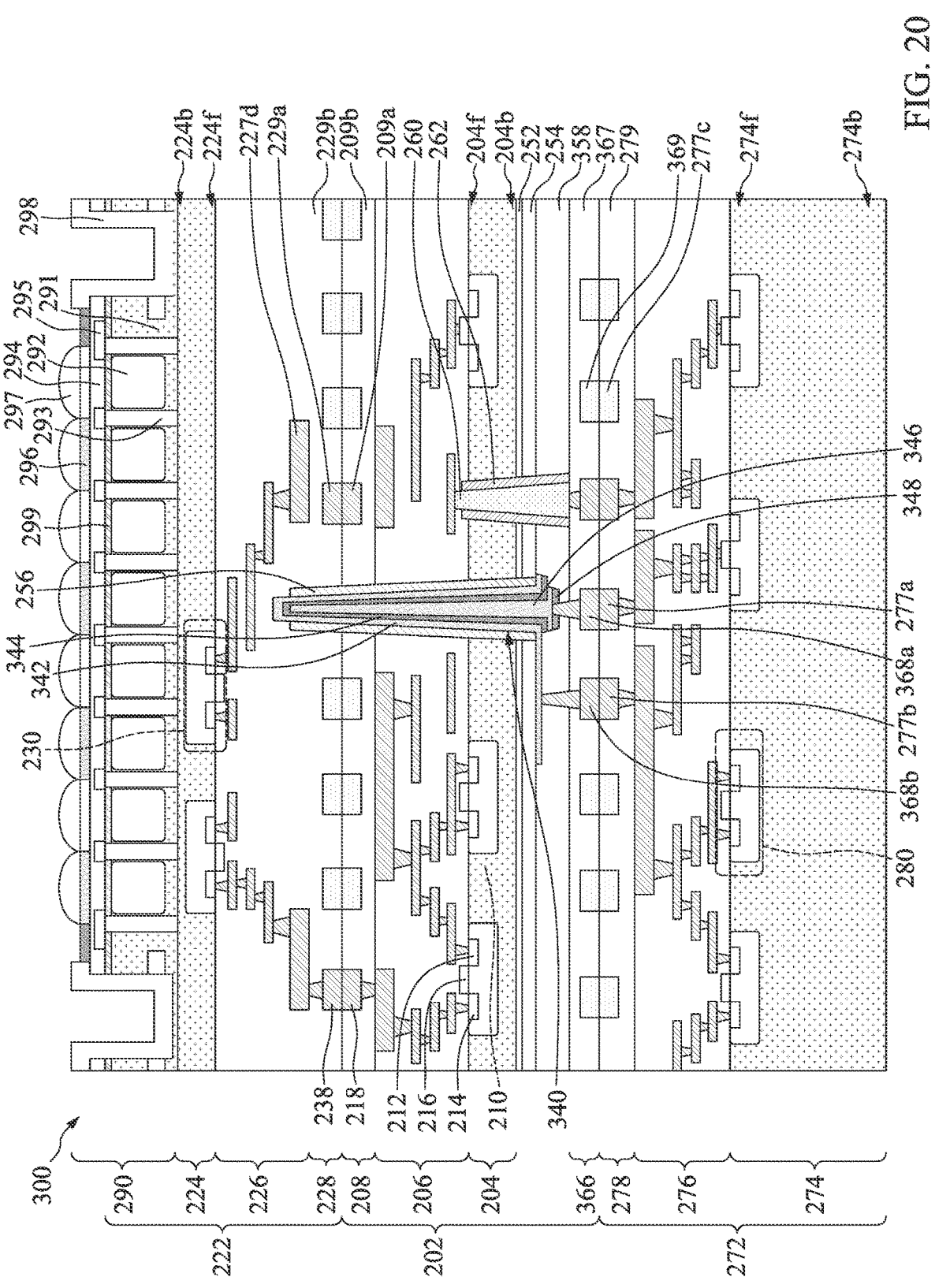

Referring to FIG. 20, operations similar to those illustrated in FIG. 16 may be repeated to bond the third die 272 to the first die 202 and form the image sensor structure 290. In some embodiments, the conductive layer 342 of the capacitor structure 340 is configured as a bottom capacitor electrode and is electrically coupled to the metal feature 368b of the bonding structure 366 in the first die 202. Further, the conductive layer 346 of the capacitor structure 340 is configured as an upper capacitor electrode and is electrically coupled to the metal feature 368a of the bonding structure 366 in the first die 202. The conductive layer 342 and the conductive layer 346 are further electrically coupled to the metal feature 277b of the bonding structure 278 and the metal feature 277a of the bonding structure 278 of the third die 272, respectively. In some embodiments, the capacitor structure 340 is electrically coupled to the semiconductor device 280 through the metal lines and metal vias of the interconnection structure 276.

The present disclosure provides embodiments of methods for forming a semiconductor structure that provide one or more improvements over existing approaches. Advantageously, by arranging a capacitor structure that extends through neighboring interconnection structures and/or neighboring bonding structures of different dies, a capacitance value of the capacitor structure may be relatively high while the capacitor structure occupies a relatively small footprint. Further, design freedom and flexibility may be high since the capacitor structures may be distributed through neighboring interconnection structures and/or neighboring bonding structures of different dies.

In accordance with some embodiments of the present disclosure, a semiconductor structure is provided. The semiconductor structure includes a first die, a second die and a capacitor structure. The first die includes a first substrate and a first interconnection structure. The first substrate has a first front-side surface and a first back-side surface. The first interconnection structure is disposed on the first front-side surface. The second die is disposed over the first front-side surface and is bonded to the first die. The second die includes a second substrate and a second interconnection structure. The second substrate has a second front-side surface and a second back-side surface. The second interconnection structure is disposed on the second front-side surface. The capacitor structure extends from the first interconnection structure to the second interconnection structure.

In accordance with some embodiments of the present disclosure, a semiconductor structure is provided. The semiconductor structure includes a first die, a second die, a third die and a capacitor structure. The first die includes a first substrate and a first bonding structure. The first substrate has a first front-side surface and a first back-side surface. The first bonding structure is disposed over the first front-side surface. The second die is bonded to the first die, and includes a second substrate and a second bonding structure. The second substrate has a second front-side surface facing the first front-side surface. The second bonding structure is disposed over the second front-side surface. The third die is bonded to the first die. The third die includes a third substrate having a third front-side surface facing the first back-side surface. The capacitor structure extends through the first bonding structure and the second bonding structure.

In accordance with some embodiments of the present disclosure, a method for forming a semiconductor structure is provided. The method includes the following operations. A first die is received. The first die has a first substrate and a first interconnection structure over the first substrate, and the first substrate has a first front-side surface and a first back-side surface. A second die is bonded to the first die. A trench penetrating through the first substrate and the first interconnection structure is formed. The trench exposes a portion of the second die. A capacitor structure is formed in the trench.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
  receiving a first die having a first substrate and a first interconnection structure over the first substrate, wherein the first substrate has a first front-side surface and a first back-side surface;
  bonding a second die to the first die, the second die having a second substrate and a second interconnection structure over the second substrate;
  forming a trench penetrating through the first substrate and the first interconnection structure, wherein the trench exposes a portion of the second die; and
  forming a capacitor structure in the trench,
  wherein the forming of the capacitor structure further comprises:
    forming a first conductive layer lining sidewalls and an innermost surface of the trench and over the first back-side surface of the first substrate;
    forming a first dielectric layer over the first conductive layer;
    forming a second conductive layer over the first dielectric layer;
    forming a second dielectric layer over the second conductive layer; and patterning the second dielectric layer, the second conductive layer, the first dielectric layer and the first conductive layer to form the capacitor structure.

2. The method of claim 1, wherein the trench exposes a metal feature in the second interconnection structure.

3. The method of claim 1, wherein the trench exposes a dielectric layer of a bonding structure between the first interconnection structure and the second interconnection structure.

4. The method of claim 1, further comprising forming a liner in the trench lining a sidewall of the first substrate prior to forming the capacitor structure in the trench.

5. A method for forming a semiconductor structure, comprising:
  bonding a first die and a second die, wherein the first die comprises a first substrate and a first interconnection structure over the first substrate, and the second die comprises a second substrate and a second interconnection structure over the second substrate;
  forming a first trench penetrating through the first die and a portion of the second die, wherein a metal feature of the second interconnection structure is exposed through the first trench; and
  forming a capacitor structure in the first trench, wherein the capacitor structure is coupled to the metal feature of the second interconnection structure,
  wherein the forming of the capacitor structure further comprises:
    forming a first conductive layer lining sidewalls and an innermost surface of the first trench and over a back side surface of the first substrate;
    forming a first dielectric layer over the first conductive layer;
    forming a second conductive layer over the first dielectric layer;
    forming a second dielectric layer over the second conductive layer; and
    patterning the second dielectric layer, the second conductive layer, the first dielectric layer and the first conductive layer to form the capacitor structure.

6. The method of claim 5, further comprising forming a liner over sidewalls of the first trench prior to the forming of the capacitor structure.

7. The method of claim 5, further comprising performing a thinning operation to reduce a thickness of the first substrate prior to the forming of the first trench.

8. The method of claim 5, wherein the first conductive layer is coupled to the metal feature of the second interconnection structure.

9. The method of claim 5, further comprising:
  forming a second trench in the first substrate, wherein the second trench exposes a metal feature of the first interconnection structure; and
  forming a through-substrate-via (TSV) in the second trench.

10. The method of claim 9, wherein the second trench is separated from the first trench.

11. The method of claim 5, further comprising bonding the first die to a third die, wherein the third die comprises a third substrate and a third interconnection structure.

12. The method of claim 11, wherein the capacitor structure is disposed between the first substrate and the third interconnection structure.

13. A method for forming a semiconductor structure, comprising:
  bonding a first die and a second die, wherein the first die comprises a first substrate and a first interconnection structure over the first substrate, and the second die comprises a second substrate and a second interconnection structure over the second substrate;

forming a first trench penetrating through the first die and a portion of the second die, wherein metal features of the second interconnection structure are separated from the first trench; and forming a capacitor structure in the first trench, wherein the forming of the capacitor further comprises:

forming a first conductive layer lining sidewalls and an innermost surface of the first trench and over a back side surface of the first substrate;

forming a first dielectric layer over the first conductive layer;

forming a second conductive layer over the first dielectric layer;

forming a second dielectric layer over the second conductive layer; and patterning the second dielectric layer, the second conductive layer, the first dielectric layer and the first conductive layer to form the capacitor structure.

14. The method of claim 13, further comprising forming a liner over sidewalls of the first trench prior to the forming of the capacitor structure.

15. The method of claim 13, further comprising performing a thinning operation to reduce a thickness of the first substrate prior to the forming of the first trench.

16. The method of claim 13, further comprising:

forming a second trench in the first substrate; and forming a through-substrate-via (TSV) in the second trench, wherein the second trench exposes a metal feature of the first interconnection structure, and the second trench is separated from the first trench.

17. The method of claim 13, further comprising bonding the first die to a third die, wherein the third die comprises a third substrate and a third interconnection structure.

18. The method of claim 17, wherein the capacitor structure is electrically connected to the third interconnection structure.

19. The method of claim 18, wherein the third die comprises a semiconductor device.

20. The method of claim 18, wherein the capacitor structure is electrically connected to the semiconductor device through the third interconnection structure.

* * * * *